(12) United States Patent
Penney et al.

(10) Patent No.: US 11,158,373 B2
(45) Date of Patent: Oct. 26, 2021

(54) APPARATUSES, SYSTEMS, AND METHODS FOR DETERMINING EXTREMUM NUMERICAL VALUES

(71) Applicant: MICRON TECHNOLOGY, INC., Boise, ID (US)

(72) Inventors: Daniel B. Penney, Wylie, TX (US); Jason M. Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/437,811

(22) Filed: Jun. 11, 2019

(65) Prior Publication Data
US 2020/0395072 A1     Dec. 17, 2020

(51) Int. Cl.
*G11C 15/04*          (2006.01)
(52) U.S. Cl.
CPC .................................. *G11C 15/04* (2013.01)
(58) Field of Classification Search
CPC .............................. G11C 15/04; G11C 19/28
USPC ...................................................... 365/49.17
See application file for complete search history.

(56) References Cited

U.S. PATENT DOCUMENTS

| | | |
|---|---|---|
| 5,291,198 A | 3/1994 | Dingwall et al. |
| 5,299,159 A | 3/1994 | Balistreri et al. |
| 5,422,850 A | 6/1995 | Sukegawa et al. |
| 5,638,317 A | 6/1997 | Tran |
| 5,699,297 A | 12/1997 | Yamazaki et al. |
| 5,768,196 A | 6/1998 | Bloker et al. |
| 5,943,283 A | 6/1999 | Wong et al. |
| 5,933,377 A | 8/1999 | Hidaka |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |

(Continued)

FOREIGN PATENT DOCUMENTS

| | | |
|---|---|---|
| CN | 1195173 A | 10/1998 |
| CN | 101038785 A | 9/2007 |

(Continued)

OTHER PUBLICATIONS

U.S. Appl. No. 15/884,192 entitled 'Semicondictor Device Performing Row Hammer Refresh Operation' filed Jan. 30, 2018.

(Continued)

*Primary Examiner* — Sung Il Cho
(74) *Attorney, Agent, or Firm* — Dorsey & Whitney LLP

(57) ABSTRACT

Embodiments of the disclosure are drawn to apparatuses and methods for determining extremum numerical values. Numerical values may be stored in files of a stack, with each bit of the numerical value stored in a content addressable memory (CAM) cell of the file. Each file may be associated with an accumulator circuit, which provides an accumulator signal. An extremum search operation may be performed where a sequence of comparison bits are compared in a bit-by-bit fashion to each bit of the numerical values. The accumulator circuits each provide an accumulator signal which indicates if the numerical value in the associated file is an extremum value or not. Examples of extremum search operations include finding a maximum of the numerical values and a minimum of the numerical values.

23 Claims, 7 Drawing Sheets

(56) References Cited

U.S. PATENT DOCUMENTS

| | | | |
|---|---|---|---|
| 6,061,290 A | 5/2000 | Shirley | |
| 6,212,118 B1 | 4/2001 | Fujita | |
| 6,310,806 B1 | 10/2001 | Higashi et al. | |
| 6,317,381 B1 | 11/2001 | Gans et al. | |
| 6,373,738 B1 * | 4/2002 | Towler | G11C 15/04 |
| | | | 365/189.07 |
| 6,392,952 B1 | 5/2002 | Chen et al. | |
| 6,424,582 B1 | 7/2002 | Ooishi | |
| 6,434,064 B2 | 8/2002 | Nagai | |
| 6,452,868 B1 | 9/2002 | Fister | |
| 6,480,931 B1 * | 11/2002 | Buti | G06F 9/3836 |
| | | | 365/49.17 |
| 6,515,928 B2 | 2/2003 | Sato et al. | |
| 6,567,340 B1 | 5/2003 | Nataraj et al. | |
| 6,950,364 B2 | 9/2005 | Kim | |
| 7,027,343 B2 | 4/2006 | Sinha et al. | |
| 7,057,960 B1 | 6/2006 | Fiscus et al. | |
| 7,082,070 B2 | 7/2006 | Hong | |
| 7,187,607 B2 | 3/2007 | Koshikawa et al. | |
| 7,203,113 B2 | 4/2007 | Takahashi et al. | |
| 7,203,115 B2 | 4/2007 | Eto et al. | |
| 7,209,402 B2 | 4/2007 | Shinozaki et al. | |
| 7,215,588 B2 | 5/2007 | Lee | |
| 7,444,577 B2 | 10/2008 | Best et al. | |
| 7,551,502 B2 | 6/2009 | Dono et al. | |
| 7,565,479 B2 | 7/2009 | Best et al. | |
| 7,830,742 B2 | 11/2010 | Han | |
| 8,174,921 B2 | 5/2012 | Kim et al. | |
| 8,400,805 B2 | 3/2013 | Yoko | |
| 8,451,677 B2 | 5/2013 | Okahiro et al. | |
| 8,625,360 B2 | 1/2014 | Iwamoto et al. | |
| 8,681,578 B2 | 3/2014 | Narui | |
| 8,756,368 B2 | 6/2014 | Best et al. | |
| 8,811,100 B2 | 8/2014 | Ku | |
| 8,862,973 B2 | 10/2014 | Zimmerman et al. | |
| 8,938,573 B2 | 1/2015 | Greenfield et al. | |
| 9,032,141 B2 | 5/2015 | Bains et al. | |
| 9,047,978 B2 | 6/2015 | Bell et al. | |
| 9,058,900 B2 | 6/2015 | Kang | |
| 9,087,602 B2 | 7/2015 | Youn et al. | |
| 9,117,544 B2 | 8/2015 | Bains et al. | |
| 9,123,447 B2 | 9/2015 | Lee et al. | |
| 9,153,294 B2 | 10/2015 | Kang | |
| 9,190,137 B2 | 11/2015 | Kim et al. | |
| 9,190,139 B2 | 11/2015 | Jung et al. | |
| 9,251,885 B2 | 2/2016 | Greenfield et al. | |
| 9,286,964 B2 | 3/2016 | Halbert et al. | |
| 9,299,457 B2 | 3/2016 | Chun et al. | |
| 9,311,985 B2 | 4/2016 | Lee et al. | |
| 9,324,398 B2 | 4/2016 | Jones et al. | |
| 9,384,821 B2 | 7/2016 | Bains et al. | |
| 9,390,782 B2 | 7/2016 | Best et al. | |
| 9,412,432 B2 | 8/2016 | Narui et al. | |
| 9,424,907 B2 | 8/2016 | Fujishiro | |
| 9,484,079 B2 | 11/2016 | Lee | |
| 9,514,850 B2 | 12/2016 | Kim | |
| 9,570,143 B2 | 2/2017 | Lim et al. | |
| 9,646,672 B1 | 5/2017 | Kim et al. | |
| 9,672,889 B2 | 6/2017 | Lee et al. | |
| 9,685,240 B1 | 6/2017 | Park | |
| 9,691,466 B1 | 6/2017 | Kim | |
| 9,697,913 B1 | 7/2017 | Mariani et al. | |
| 9,734,887 B1 | 8/2017 | Tawa | |
| 9,741,409 B2 | 8/2017 | Jones et al. | |
| 9,741,447 B2 | 8/2017 | Akamatsu | |
| 9,747,971 B2 | 8/2017 | Bains et al. | |
| 9,761,297 B1 | 9/2017 | Tomishima | |
| 9,786,351 B2 | 10/2017 | Lee et al. | |
| 9,799,391 B1 | 10/2017 | Wei | |
| 9,805,782 B1 | 10/2017 | Liou | |
| 9,805,783 B2 | 10/2017 | Ito et al. | |
| 9,818,469 B1 | 11/2017 | Kim et al. | |
| 9,865,326 B2 | 1/2018 | Bains et al. | |
| 9,865,328 B1 | 1/2018 | Desimone | |
| 9,922,694 B2 | 3/2018 | Akamatsu | |
| 9,934,143 B2 | 4/2018 | Bains et al. | |
| 9,953,696 B2 | 4/2018 | Kim | |
| 10,032,501 B2 | 7/2018 | Ito et al. | |
| 10,083,737 B2 | 9/2018 | Bains et al. | |
| 10,090,038 B2 | 10/2018 | Shin | |
| 10,134,461 B2 | 11/2018 | Bell et al. | |
| 10,147,472 B2 | 12/2018 | Jones et al. | |
| 10,153,031 B2 | 12/2018 | Akamatsu | |
| 10,170,174 B1 | 1/2019 | Ito et al. | |
| 10,176,860 B1 | 1/2019 | Mylavarapu | |
| 10,210,925 B2 | 2/2019 | Bains et al. | |
| 10,297,305 B1 | 5/2019 | Moon et al. | |
| 10,339,994 B2 | 7/2019 | Ito et al. | |
| 10,381,327 B2 | 8/2019 | Ramachandra et al. | |
| 10,387,276 B2 | 8/2019 | Ryu et al. | |
| 10,446,216 B2 | 10/2019 | Oh et al. | |
| 10,490,251 B2 | 11/2019 | Wolff | |
| 10,600,462 B2 | 3/2020 | Augustine et al. | |
| 10,600,491 B2 | 3/2020 | Chou et al. | |
| 10,607,686 B2 | 3/2020 | Akamatsu | |
| 10,629,286 B2 | 4/2020 | Lee et al. | |
| 10,679,710 B2 | 6/2020 | Hirashima et al. | |
| 10,770,127 B2 | 9/2020 | Shore et al. | |
| 10,811,066 B2 | 10/2020 | Jones et al. | |
| 10,832,792 B1 | 11/2020 | Penney et al. | |
| 10,861,519 B2 | 12/2020 | Jones et al. | |
| 10,867,660 B2 | 12/2020 | Akamatsu | |
| 10,930,335 B2 | 2/2021 | Bell et al. | |
| 10,943,636 B1 | 3/2021 | Wu et al. | |
| 10,950,289 B2 | 3/2021 | Ito et al. | |
| 10,964,378 B2 | 3/2021 | Ayyapureddi et al. | |
| 2001/0008498 A1 | 7/2001 | Ooishi | |
| 2002/0078311 A1 | 6/2002 | Matsuzaki et al. | |
| 2002/0080677 A1 | 6/2002 | Watanabe et al. | |
| 2002/0181301 A1 | 12/2002 | Takahashi et al. | |
| 2003/0063512 A1 | 4/2003 | Takahashi et al. | |
| 2003/0067825 A1 | 4/2003 | Shimano et al. | |
| 2003/0090400 A1 | 5/2003 | Barker | |
| 2003/0123301 A1 | 7/2003 | Jang et al. | |
| 2003/0193829 A1 | 10/2003 | Morgan et al. | |
| 2003/0231540 A1 | 12/2003 | Lazar et al. | |
| 2004/0008544 A1 | 1/2004 | Shinozaki et al. | |
| 2004/0022093 A1 | 2/2004 | Lee | |
| 2004/0052142 A1 | 3/2004 | Ikehashi et al. | |
| 2004/0114446 A1 | 6/2004 | Takahashi et al. | |
| 2004/0130959 A1 | 7/2004 | Kawaguchi | |
| 2004/0174757 A1 | 9/2004 | Garverick et al. | |
| 2004/0184323 A1 | 9/2004 | Mori et al. | |
| 2004/0218431 A1 | 11/2004 | Chung et al. | |
| 2005/0105315 A1 | 5/2005 | Shin et al. | |
| 2005/0243629 A1 | 11/2005 | Lee | |
| 2005/0265104 A1 | 12/2005 | Remaklus et al. | |
| 2006/0083099 A1 | 4/2006 | Bae et al. | |
| 2006/0087903 A1 | 4/2006 | Riho et al. | |
| 2006/0176744 A1 | 8/2006 | Stave | |
| 2006/0262616 A1 | 11/2006 | Chen | |
| 2007/0008799 A1 | 1/2007 | Dono et al. | |
| 2007/0014174 A1 | 1/2007 | Ohsawa | |
| 2007/0028068 A1 | 2/2007 | Golding et al. | |
| 2007/0030746 A1 | 2/2007 | Best et al. | |
| 2007/0033339 A1 | 2/2007 | Best et al. | |
| 2007/0133330 A1 | 6/2007 | Ohsawa | |
| 2007/0297252 A1 | 12/2007 | Singh | |
| 2008/0028260 A1 | 1/2008 | Oyagi et al. | |
| 2008/0031068 A1 | 2/2008 | Yoo et al. | |
| 2008/0126893 A1 | 5/2008 | Harrand et al. | |
| 2008/0130394 A1 | 6/2008 | Dono et al. | |
| 2008/0181048 A1 | 7/2008 | Han | |
| 2008/0224742 A1 | 9/2008 | Pomichter | |
| 2008/0253212 A1 | 10/2008 | Iida et al. | |
| 2008/0266990 A1 | 10/2008 | Loeffler | |
| 2008/0288720 A1 * | 11/2008 | Atwal | G11C 15/04 |
| | | | 711/108 |
| 2008/0316845 A1 | 12/2008 | Wang et al. | |
| 2009/0021999 A1 | 1/2009 | Tanimura et al. | |
| 2009/0059641 A1 | 3/2009 | Jeddeloh | |
| 2009/0077571 A1 | 3/2009 | Gara et al. | |
| 2009/0161457 A1 | 6/2009 | Wakimoto | |
| 2009/0168571 A1 | 7/2009 | Pyo et al. | |

(56) References Cited

U.S. PATENT DOCUMENTS

| | | |
|---|---|---|
| 2009/0185440 A1 | 7/2009 | Lee |
| 2009/0201752 A1 | 8/2009 | Riho et al. |
| 2009/0213675 A1 | 8/2009 | Shino |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus et al. |
| 2011/0069572 A1 | 3/2011 | Lee et al. |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0107623 A1 | 5/2013 | Kavalipurapu et al. |
| 2013/0173971 A1 | 7/2013 | Zimmerman et al. |
| 2013/0254475 A1 | 9/2013 | Perego et al. |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1* | 5/2014 | Li .................... G11C 16/3459 711/103 |
| 2014/0143473 A1 | 5/2014 | Kim et al. |
| 2014/0177370 A1 | 6/2014 | Halbert et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0355332 A1 | 12/2014 | Youn et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Nardi et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0099043 A1 | 4/2016 | Tu |
| 2016/0125931 A1 | 5/2016 | Doo et al. |
| 2016/0133314 A1 | 5/2016 | Hwang et al. |
| 2016/0140243 A1* | 5/2016 | Adams ................ G06F 16/9535 707/706 |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |

(56) References Cited

U.S. PATENT DOCUMENTS

| | | |
|---|---|---|
| 2019/0161341 A1 | 5/2019 | Howe |
| 2019/0196730 A1 | 6/2019 | Imran |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2020/0005857 A1 | 1/2020 | Ito et al. |
| 2020/0075106 A1 | 3/2020 | Tokutomi et al. |
| 2020/0082873 A1 | 3/2020 | Wolff et al. |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0158861 A1 | 5/2021 | Jeong et al. |
| 2021/0201984 A1 | 7/2021 | Khasawneh et al. |

FOREIGN PATENT DOCUMENTS

| | | |
|---|---|---|
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| CN | 104350546 A | 2/2015 |
| CN | 106710621 A | 5/2017 |
| CN | 107871516 A | 4/2018 |
| JP | H0773682 A | 3/1995 |
| JP | 2005-216429 A | 8/2005 |
| JP | 2011-258259 | 12/2011 |
| JP | 2011-258259 A | 12/2011 |
| JP | 4911510 B2 | 1/2012 |
| JP | 2013-004158 A | 1/2013 |
| KR | 1020180064940 A | 6/2018 |
| KR | 1020180085184 A | 7/2018 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020191222 A1 | 9/2020 |
| WO | 2021003085 A1 | 1/2021 |

OTHER PUBLICATIONS

U.S. Appl. No. 16/936,297 titled "Apparatuses and Methods for Managing Row Access Counts" filed Jul. 22, 2020.
U.S. Appl. No. 16/797,658, titles "Apparatuses and Methods for Controlling Refresh Operations", filed Feb. 21, 2020.
U.S. Appl. No. 15/881,256 entitled 'Apparatuses and Methods for Detecting a Row Hammer Attack With a Bandpass Filter' filed Jan. 26, 2018.
U.S. Appl. No. 16/513,400 titled "Apparatuses and Methods for Tracking Row Accesses" filed Jul. 16, 2019.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed Oct. 27, 2017; pp. all.
U.S. Appl. No. 16/176,932, titled "Apparatuses and Methods for Access Based Refresh Timing", filed Oct. 31, 2018.
U.S. Appl. No. 16/237,291, titled "Apparatus and Methods for Refreshing Memory", filed Dec. 31, 2018.
U.S. Appl. No. 16/805,197, titled "Apparatuses and Methods for Calculating Row Hammer Refresh Addresses in a Semiconductor Device", dated Feb. 28, 2020.
U.S. Appl. No. 16/459,520 titled "Apparatuses and Methods for Monitoring Word Line Accesses", filed Jul. 1, 2019, pp. all.
U.S. Appl. No. 16/012,679, titled "Apparatuses and Methods for Multiple Row Hammer Refresh Address Sequences", filed Jun. 19, 2018.
U.S. Appl. No. 16/020,863, titled "Semiconductor Device", filed Jun. 27, 2018.
U.S. Appl. No. 16/268,818, titled "Apparatuses and Methods for Managing Row Access Counts", filed Feb. 6, 2019.
U.S. Appl. No. 16/358,587, titled "Semiconductor Device Having Cam That Stores Address Signals", dated Mar. 19, 2019.
U.S. Appl. No. 16/411,573 titled "Apparatuses, Systems, and Methods for a Content Addressable Memory Cell" filed May 14, 2019.
U.S. Appl. No. 16/411,698 title "Semiconductor Device" filed May 14, 2019.
U.S. Appl. No. 16/427,330 titled "Apparatuses and Methods for Storing Victim Row Data" filed May 30, 2019.
U.S. Appl. No. 16/428,625 titled "Apparatuses and Methods for Tracking Victim Rows" filed May 31, 2019.
U.S. Appl. No. 15/715,846, entitled "Semiconductor Device", filed Sep. 26, 2017, pp. all.
"U.S. Appl. No. 15/281,818, entitled: "Semiconductor Device" filed Sep. 30, 2016".
Kim, et al., "Flipping Bits in MemoryWithout Accessing Them: An Experimental Study of DRAM Disturbance Errors", IEEE, Jun. 2014, 12 pgs.
Thomas, et al., "Voltage Source Based Voltage-to-Time Converter", IEEE, 2020, p. All.
U.S. Appl. No. 16/546,152 titled "Apparatuses and Methods for Analog Row Access Tracking" filed Aug. 20, 2019.
U.S. Appl. No. 16/548,027 titled "Apparatuses, Systems, and Methods for Analog Row Access Rate Determination" filed Aug. 22, 2019.
U.S. Appl. No. 16/549,942 titled "Apparatuses and Methods for Lossy Row Access Counting" filed Aug. 23, 2019.
U.S. Appl. No. 16/425,525 titled "Apparatuses and Methods for Tracking All Row Accesses" filed May 29, 2019.
U.S. Appl. No. 16/427,105 titled "Apparatuses and Methods for Priority Targeted Refresh Operations" filed May 30, 2019.
U.S. Appl. No. 16/427,140 titled "Apparatuses and Methods for Tracking Row Access Counts Between Multiple Register Stacks" filed May 30, 2019.
U.S. Appl. No. 17/102,266, titled "Apparatuses and Methods for Tracking Word Line Accesses", dated Nov. 23, 2020.

(56) References Cited

OTHER PUBLICATIONS

U.S. Appl. No. 17/154,945 titled "Apparatuses, Systems, and Methods for a Content Addressable Memory Cell" filed Jan. 21, 2021, pp. all.
U.S. Appl. No. 17/168,036 titled "Apparatuses and Methods for Analog Row Access Tracking" filed Feb. 4, 2021, pp. all.
U.S. Appl. No. 17/170,616 titled "Apparatuses, Systems, and Methods for Analog Row Access Rate Determination" filed Feb. 8, 2021, pp. all.
U.S. Appl. No. 16/818,981 titled "Apparatuses and Methods for Staggered Timing of Targeted Refresh Operations" filed Mar. 13, 2020, pp. all.
U.S. Appl. No. 16/824,460, titled "Semiconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018, pp. all.
U.S. Appl. No. 16/783,063, titled "Apparatus and Methods for Triggering Row Hammer Address Sampling", dated Feb. 5, 2020, pp. all.
U.S. Appl. No. 16/232.837, titled "Apparatuses and Methods for Distributed Targeted Refresh Operations", filed Dec. 26, 2018, pp. all.
U.S. Appl. No. 16/818,989, titled "Semiconductor Device Performing Row Hammer Refresh Operation", dated Mar. 13, 2020, pp. all.
U.S. Appl. No. 16/286,187 titled "Apparatuses and Methods for Memory Mat Refresh Sequencing" filed on Feb. 26, 2019, pp. all.
U.S. Appl. No. 16/084.119, titled "Apparatuses and Methods for Puretime, Self Adopt Sampling for Row Hammer Refresh Sampling", filed Sep. 11, 2018, pp. all.
U.S. Appl. No. 16/886,284 titled "Apparatuses and Methods for Access Based Refresh Timing" filed May 28, 2020, pp. all.
U.S. Appl. No. 16/886,284 titled "Apparatuses and Methods for Access Based Refresh Timing", dated May 28, 2020, pp. all.
U.S. Appl. No. 16/375,716 titled "Apparatuses and Methods for Staggered Timing of Targeted Refresh Operations" filed on Apr. 4, 2019; pp. all.
U.S. Appl. No. 16/549,411 titled "Apparatuses and Methods for Adjusting Victim Data" filed Oct. 1, 2020, pp. all.
U.S. Appl. No. 16/549,411 titled "Apparatuses and Methods for Dynamic Refresh Allocation" filed Aug. 23, 2019, pp. all.
U.S. Appl. No. 16/655,110 titled "Apparatus and Methods for Dynamic Targeted Refresh Steals" filed Oct. 16, 2019, pp. all.
International Application No. POT/US19/40169 titled "Apparatus and Methods for Triggering Row Hammer Address Sampling" filed Jul. 1, 2019, pp. all.
International Application No. PCT/US19/64028, titled "Semiconductor Device Performing Row Hammer Refresh Operation", dated Dec. 2, 2019, pp. all.
International Application No. PCT/US20/26689, titled "Apparatuses and Methods for Staggered Timing of Targeted Refresh Operations", dated Apr. 3, 2020, pp. all.
U.S. Appl. No. 16/537,981, titled "Semiconductor Device Performing Row Hammer Refresh Operation", dated Feb. 12, 2020, pp. all.
U.S. Appl. No. 16/537,981 titled "Apparatuses and Methods for Controlling Targeted Refresh Rates" filed Aug. 12, 2019, pp. all.
U.S. Appl. No. 17/201,941 titled "Apparatuses and Methods for Dynamically Allocated Aggressor Detection" filed Jan. 20, 2021, pp. all.
U.S. Appl. No. 17/201,941 titled "Apparatuses and Methods for Sketch Circuits for Refresh Binning" filed Mar. 15, 2021, pp. all.
U.S. Appl. No. 17/301,533 titled "Semiconductor Device Having Cam That Stores Address Signals" filed Apr. 6, 2021, pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018, pp. all.
U.S. Appl. No. 16/290.730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/431,641 titled "Apparatuses and Methods for Controlling Steal Rates" filed Jun. 4, 2019, pp. all.
U.S. Appl. No. 16/682,606, titled "Apparatuses And Methods For Distributing Row Hammer Refresh Events Across A Memory Device", filed Nov. 13 2019, pp. all.
U.S. Appl. No. 16/459,507 titled "Apparatuses and Methods for Adjusting Victim Data", filed Jul. 1, 2019, pp. all.
U.S. Appl. No. 17/375,817 titled "Apparatuses and Methods for Monitoring Word Line Accesses" filed Jul. 14, 2021, pp. all.
U.S. Appl. No. 17/443,056 titled "Apparatuses and Methods for Multipi F Row Hammer Refresh Address Sequences" filed Jul. 20, 2021, pp. all.
U.S. Appl. No. 17/444,925 titled "Apparatuses and Methods for Countering Memory Attacks" filed Aug. 12, 2021, pp. all.
U.S. Appl. No. 17/446,710 titled "Apparatuses, Systems, and Methods for Determining Extremum Numericalvalues" filed Sep. 1, 2021, pp. all.

\* cited by examiner

APPARATUSES, SYSTEMS, AND METHODS FOR DETERMINING EXTREMUM NUMERICAL VALUES

BACKGROUND

This disclosure relates generally to semiconductor devices, and more specifically to semiconductor components used for storing bits. Semiconductor logic devices may generally operate with a binary logic, where signals and information are stored as one or more bits, each of which may be at a high logical level or a low logical level. There may be a number of applications where it is useful to store a number of numerical values, encoded as binary numbers with each digit of the binary number stored as bit. For example, a memory device may store numerical values which are counts of the access operations to wordlines of a memory. In many applications it may further be desirable to determine a maximum (and or minimum) value of the store numerical values. For example, to identify which wordline (s) have been accessed the most.

DETAILED DESCRIPTION

Figure 1:
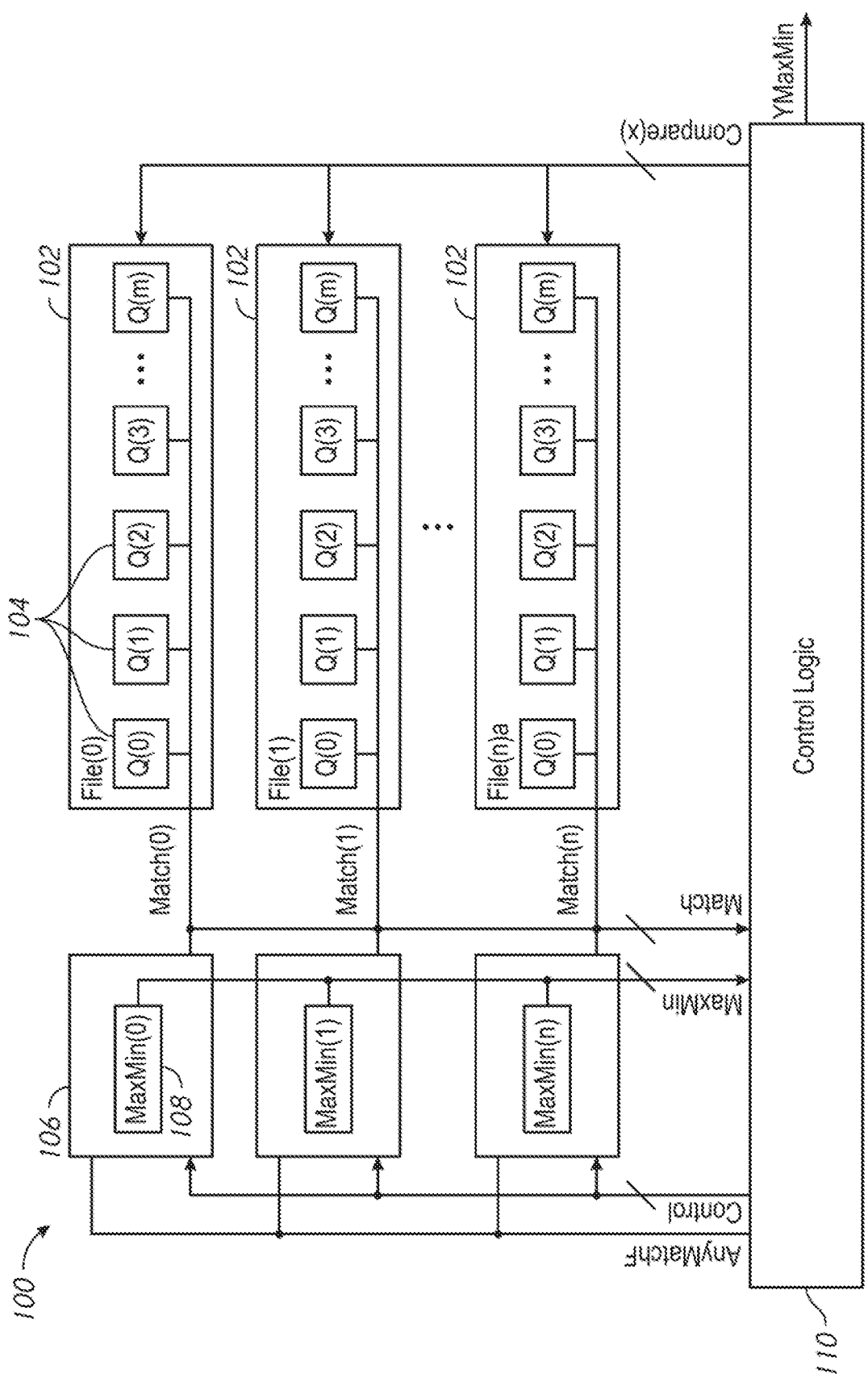
FIG. 1 is a block diagram of a stack according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a semiconductor device may generally be represented by one or more binary bits, with each bit being at a high logical level (e.g., 1) or a low logical level (e.g., 0). Each bit may be stored in a memory cell such as a latch circuit. The memory cell may store a particular bit of information, which may later be retrieved and/or overwritten by a new bit of information to be stored. A group of memory cells may be organized together to form a file (or register), which stores information (e.g., data) including a number of bits. A number of files (e.g., a register) may be organized into a stack (e.g., a data storage unit), to store multiple pieces of information (e.g., each file may have N latch circuits to store information including N bits, and there may be M files in the stack). The number of files in a stack may generally be referred to as a depth of the stack. The number of latch circuits in a register may generally be referred to as a width of the stack.

A stack may include numerical values stored in the different registers. The numerical values may be represented as binary numbers, where each bit of the binary number is stored in a different memory cells. It may be desirable to search the stack to determine which of the stored numerical values has an extremum value, such as a maximum value and/or a minimum value. However, it may be a time consuming and/or power intensive process to read out all of the numerical values to a circuit which interprets the numerical value and searches for the maximum/minimum in the register stack. It may be desirable to search the stack for an extremum value by searching the numerical values on a bit-by-bit basis.

The present disclosure is drawn to apparatuses, systems, and methods for determining maximum and minimum numerical values stored in content addressable memory (CAM) cells. A stack may contain a number of files, each of which is made of a number of CAM cells. A numerical value (represented as a binary number) may be stored in one or more of the files, with each bit of the numerical value in one of the CAM cells of the file. Each CAM cell may have a latch portion to store a bit and a comparator portion which returns a match signal based on a comparison between the stored bit and an external bit. Each file may be coupled to an accumulator circuit which stores an accumulator signal. During an extremum search operation, a comparison bit may be compared to each bit in each of the files, the comparison bits may be provided starting with the most significant bit and working to the least significant. For example, a comparison bit may be compared to each of the most significant bits in each of the files, then the next most significant bit in each of the files etc. In some embodiments, the comparison bit may be compared to each of the most significant bits in all of the files simultaneously. The accumulator circuits may change the state of the accumulator signal based on the match signals from the files in the stack as the comparison bits are provided. An extremum numerical value (e.g., a maximum or minimum) stored in the stack may be identified based on the states of the accumulator signals.

FIG. 1 is a block diagram of a stack according to an embodiment of the present disclosure. The stack 100 includes a number of files 102, each of which includes a number of content addressable memory (CAM) cells 104. The CAM cells 104 in file 102 are coupled in common to a signal line which carries a respective match signal Match based on a comparison of the stored bits Q in the CAM cells 104 to an external signal Compare. Each file 102 is coupled to an accumulator circuit 106 which stores and determines a state of an accumulator signal MaxMin. The stack 100 also includes a control logic circuit 110 which may provide signals to perform comparison operations as part of an extremum search operation to determine the file(s) 102 which contain extremum numerical values. Various actions may be performed based on the extremum search operation. For example, the control logic may provide a signal YMaxMin which indicates the index/indices of one or more of the files 102 which contain an extremum numerical value (e.g., the maximum or minimum value).

The stack 100 includes a number of files 102, which may store data in one or more fields of the file 102. Each field may include a number of CAM cells 104, each of which stores a bit of the data in that field. For the sake of brevity and clarity, the files 102 of FIG. 1 are shown to include only a single field, which contains a numerical value. Other example embodiments may contain multiple fields per file 102, some of which may numerical values (e.g., count values) and some of which may be non-numerical data (e.g., row addresses, flags). In general, the CAM cells 104 of each field are coupled in common to a different signal line which carries a match signal for that field. Since the example of FIG. 1 includes only a single field, only a single match signal line is shown and discussed.

The stack 100 may have a number of files 102, which is generally referred to as a depth of the stack 100. The example stack 100 of FIG. 1 includes n files 102, which may generally be referenced by the index Y. Thus, a given file 102 may be referred to as File(Y), where Y is any value between 0 and n (inclusive). Each file 102 of the stack 100 may include a number of CAM cells 104, which is generally referred to as a width of the stack 100. The example stack 100 of FIG. 1 includes indifferent CAM cells 104, which may generally be referenced by the index X. Thus, a given CAM cell 104 within a specified file 102 may be referred to as Cell(X), where X is any value between 0 and m (inclusive). Each CAM cell 104 may store a bit of information, which may generally be referred to as stored bit Q(X), where X is any value between 0 and m (inclusive). Accordingly, the stack 100 may have a total of n×m CAM cells 104.

All of the CAM cells 104 in a given file 102 may be coupled in common to a signal line which provides a match signal Match. Since there are as many signals Match as there are files 102, the match signals may generally be referred to as Match(Y), where Y is any number between 0 and n (inclusive). Each file 102 may receive external information, which may be compared to one or more specified bits Q stored in the CAM cells 104 of that file 102. Each of the CAM cells 104 within a given File(Y) 102 may be capable of changing the state of the corresponding signal Match(Y) based on the comparison between the stored bit(s) Q and the provided external information.

In some embodiments, the CAM cells 104 may use dynamic logic to determine a state of the associated signal Match(Y). For example, all of the signals Match(Y) may be precharged to a first logical level which indicates a match between the stored bit Q and the provided external bit. The signals Match(Y) may be precharged by one or more driver circuits (not shown). In some embodiments, the accumulator circuit 106 coupled to the signal line Match(Y) may include the driver circuit and may pre-charge the signal line responsive to a control signal from the control logic 110. If a CAM cell 104 determines there is not a match, it may change the state of the associated signal Match(Y) to a second logical level which indicates there is not a match. The operation of an example CAM cell 104 is described in more detail in FIG. 3.

Each of the signals Match(Y) is coupled to an accumulator circuit 106. There may be a number of accumulator circuits, n, which matches a depth of the stack 100. Each accumulator circuit 106 has an accumulator latch 108 which stores an accumulator signal MaxMin(Y). At the beginning of an extremum search operation, all of the accumulator signals MaxMin may be set to a first level (e.g., a high logic level). As the comparison signals Compare(X) are provided, the states of the accumulator signals MaxMin may change to a second level to indicate that the associated file 102 has been disqualified and does not include an extremum value. After the control logic circuit 110 performs an extremum search operation the states of the accumulator signals MaxMin(Y) indicate if the associated file 102 is an extremum value or not. The structure and operation of an example accumulator circuit is described in more detail in FIG. 4.

The control logic circuit 110 may perform an extremum search operation by performing a sequence of comparison operations. During one of these comparison operations, the control logic 110 may provide a comparison signal Compare (X). The signal Compare(X) may be signal provided to all of the CAM cells 104 with a particular index X, in all of the files 102. The states of the match signals Match may be used to determine if the state of the stored bit Q(X) in any of the files 102 matches the state of the comparison signal Compare(X). For example, Compare(X) may be provided at a high logical level. Accordingly, the match signal Match(Y) may be at a high logical level if the bit Q(X) in the given File(Y) is at a high logical level, and may be at a low logical level otherwise. The state of the signal Compare(X) may determine the type of extremum search operation. If the signal Compare(X) is provided at a high logic level, the extremum search operation may be a maximum search operation. If the signal Compare(X) is provided at a low logic level, the extremum search operation may be a minimum search operation.

In some embodiments, during an extremum search operation, the control logic circuit 110 may perform comparison operations (e.g., provide Compare(X)) from a most significant bit Q(m) to a least significant bit Q(0) in the files 102. The accumulator circuits 106 may be set up such that during an extremum search operation, the state of all of the accumulator signals MaxMin(Y) may start the extremum search operation at a first state, and change to a second state if Match(Y) indicates that there is not a match during the current comparison operation, unless all of the signals Match indicate that there is no match in the given comparison operation in which case the accumulator signal MaxMin (Y) may remain at the same state, regardless of the state of the associated match signal Match(Y).

The accumulator circuit 106 may be coupled in common to a signal AnyMatchF which indicates whether any of the match signals Match(Y) indicated a match after each of the comparison signals Compare(X) were provided. The signal AnyMatchF may indicate if there was a match for any of the accumulator circuits where the accumulator signal MaxMin (Y) is still at an initial state (e.g., a high logical level). Accumulator circuits 106 where the accumulator signal MaxMin(Y) has already changed to a second state (e.g., a low logical level) may not be used to determine the state of the signal AnyMatchF.

The signal AnyMatchF may be used by the accumulator circuits 106 to determine, in pan, whether to change the state of the accumulator signal MaxMin(Y) or not. In some example embodiments, the control logic circuit 110 may receive all of the match signals Match, and may provide the signal AnyMatchF based on the states of the signals Match (Y) and their associated accumulator signals MaxMin(Y). In some example embodiments, the accumulator circuits 106 may be coupled in common to a signal line carrying AnyMatchF, and each of the accumulator circuits 106 may change a state of the signal AnyMatchF on the signal line based on the state of the match signal Match(Y) coupled to that accumulator circuit 106 and the state of the accumulator signal MaxMin(Y) stored in that accumulator circuit 106. During a given extremum search operation, once an accumulator signal MaxMin(Y) has changed to a second state, it may not change back to the first logical level until after the extremum search operation has finished. The process of performing an extremum search operation is described in more detail in FIG. 2.

In some embodiments, after all of the comparison operations as part of the extremum search operation, the control logic circuit 110 and/or the accumulator circuits 106 may resolve any ties. For example, if the extremum search operation is searching for a maximum numerical value, it may happen that more than one of the files 102 contains the same numerical value which is the maximum numerical value. The stack 100 may resolve the tie by, for example, keeping the accumulator signal MaxMin(Y) associated with the file 102 with the lowest index (e.g., the File(Y) for the lowest value of Y of the files 102 containing the tied maximum values) at a high level, and setting the accumulator signals MaxMin of the other accumulator circuits 106 to a low level.

In some embodiments, the accumulator circuits 106 may be coupled together in a 'daisy-chain' fashion such that a given Accumulato(Y) receives the accumulator signal MaxMin(Y−1) from a previous Accumulator(Y−1) and provides its accumulator signal MaxMin(Y) to a next Accumulator(Y+1). Additional control signals (not shown) may also be coupled between the accumulator circuits 106 in a 'daisy-chain' fashion. These daisy chained signals may allow the accumulator circuits 106 to resolve tics such that only a single one of the accumulator signals MaxMin(Y) remains at a high level after an extremum search operation.

In some embodiments, the control logic 110 may determine if no extremum value is found, and may provide one or more signals (not shown) which indicate that the extremum search operation did not return a value. For example, if all of the files 102 contain a numerical value which is 0. then the extremum search operation may not return a result. In some embodiments, the control logic 110 may still indicate a particular file (e.g., with the signal YMaxMin) in addition to (or instead of) the signal indicating that no extremum value was found.

As well as providing the comparison signals Compare(X) and the signal AnyMatchF, the control logic 110 may also provide other control signals, which are represented in FIG. 1 as the signal Control. The control signals Control may be used to operate the accumulator circuits 106 during an extremum search operation. The control logic circuit 110 may be a state machine, which provides a sequence of different control signals to operate the accumulator circuits 106. For example, one of the control signals may be used to indicate that an extremum search operation is about to begin and that the states of all of the accumulator signals MaxMin (Y) should be set to a first state. The control signals Control may generally be provided in common to the accumulator circuits 106. Different example control signals and their operation are discussed in more detail in FIG. 4.

For the sake of clarity, the stack 100 of FIG. 1 is only shown coupled to a control logic circuit 110 and the signals used in an extremum search operation. The stack 100 may also be coupled to input data and to write signals, which may be used to overwrite one or more of the bits Q in the file 102 with associated bits of the input data. The stack 100 may also provide one or more of the stored bits Q from one or more of the files 102. For example, a given file 102 may provide its stored numerical value (e.g., bits Q(0 to m)) to a counter circuit, which may update the numerical value (e.g., increment it) and then provide a write signal such that the updated value is written back to the file 102 into the CAM cells 104. In some embodiments, the state of the write signal, which determines if new data may be written to the file 102 may be determined, in part, by the accumulator circuit 106 based on the state of the accumulator signal MaxMin.

Figure 2:
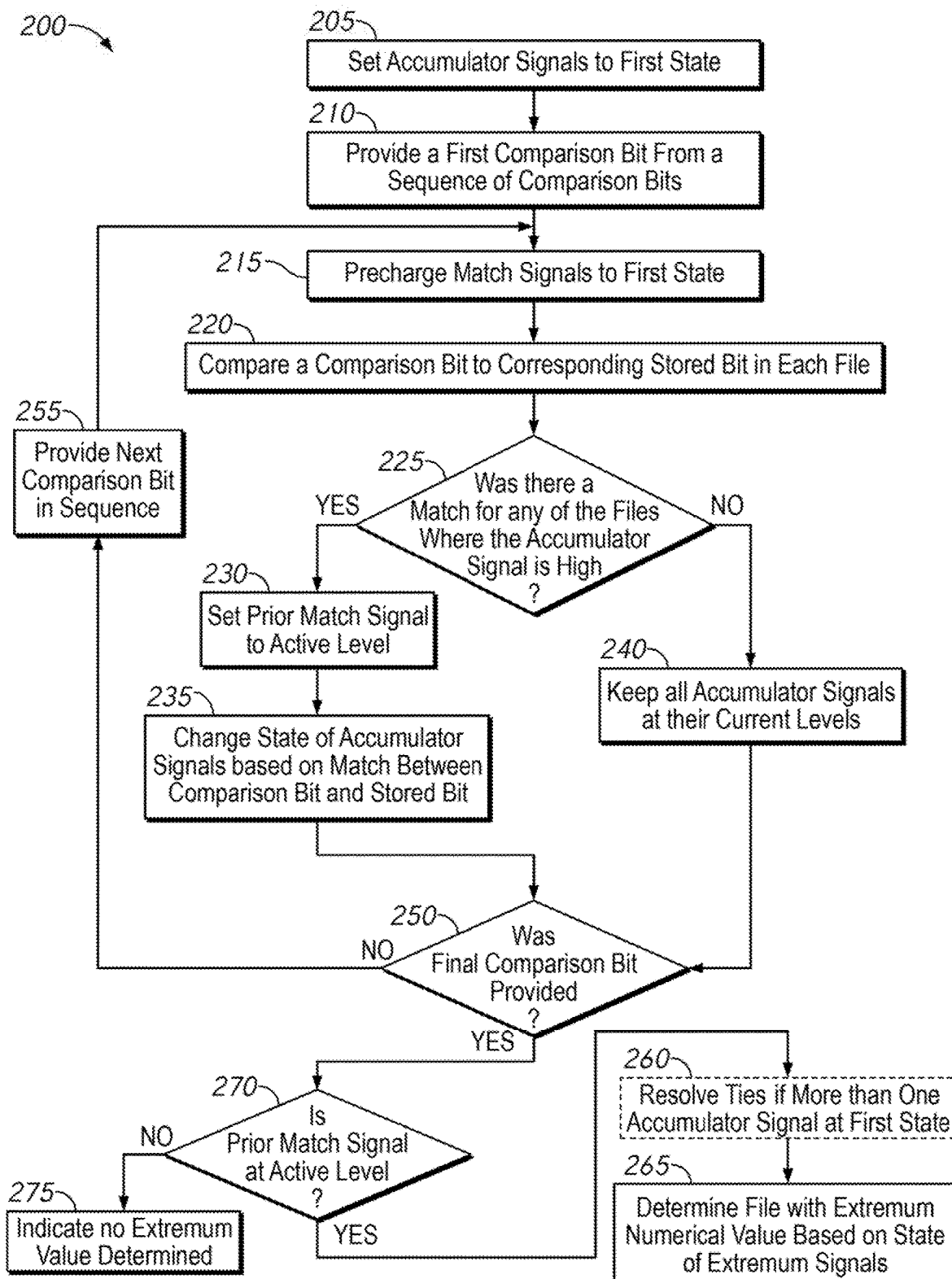
FIG. 2 is a flow chart of a method of performing an extremum search operation according to an embodiment of the present disclosure.

FIG. 2 is a flow chart of a method of performing an extremum search operation according to an embodiment of the present disclosure. The method 200 may be implemented by the stack 100 of FIG. 1. in sonic embodiments.

The method 200 may generally begin with block 205, which describes setting accumulator signals to a first state. The accumulator signals (e.g., MaxMin(Y) of FIG. 1) may be stored in accumulator latches in accumulator circuits (e.g., accumulator latches 108 in accumulator circuits 106 of FIG. 1). In some embodiments all of the accumulator signals may be set to a first state. In some embodiments, the accumulator signal may be a one bit signal (e.g., an accumulator bit) and the first state may be a high logic level. In some embodiments, a control logic circuit (e.g., 110 of FIG. 1) may send an initialization signal. Responsive to receiving the initialization signal the accumulator circuits may store a high logical level in their accumulator latches as the accumulator signal. In some embodiments, block 205 may also include setting various other signals to an initial state. For example, the prior match signal (described in more detail in FIG. 4) may also be set to an initial inactive level.

Block 205 may generally be followed by block 210, which describes providing a first comparison bit from a sequence of comparison bits. Each comparison bit (e.g., Compare(X) of FIG. 1) may be provided to all of the bits in a given position in each of the files (e.g., files 102 of FIG. 1) of a stack. For example, if the given comparison bit in the sequence is the Xth bit, then the comparison bit may be provided in common to the bits Q(X) in all of the files. In some embodiments, the sequence may begin with a most significant bit (e.g., Q(m)) and then count down bit-by-bit to a least significant bit (e.g., Q(0)). Accordingly at the block 210, a first comparison bit may be provided to the bits Q(i) and then the next comparison bit may be provided to the bits Q(i−1) etc.

The state of the comparison bits may determine the type of extremum search operation that is being performed. For example, if the extremum search operation is searching for a maximum numerical value in the stack, then the comparison bits may be provided at a high logical level. If the extremum search operation is searching for a minimum numerical value in the stack, then the comparison bits may be provided at a low logical level.

Block 210 may generally be followed by block 215, which describes pre-charging the match signals to a first state. The signal lines carrying the match signals (e.g., Match(Y) of FIG. 1) may each be charged to a voltage level which represents a high logical level. The control logic may send a pre-charge signal to driver circuits (which may be located in the accumulator circuits). The pre-charge signal may activate the driver circuits, pre-charging the signal lines.

Block 215 may generally be followed by block 220, which describes comparing the comparison bit to the corresponding stored bit in each file. As previously discussed, a comparison bit Compare(X) may be provided in common to all of the bits Q(X) with a given index X in all of the files. Each CAM cell storing the bits Q(X) may compare the state of the stored bit Q(X) to the comparison bit Compare(X). If there is a match (e.g., the bits have the same stale) then the match signal Match(Y) for that file may remain at a first state (e.g., a high logical level). If there is not a match, the CAM cell may change the state of the match signal Match(Y) to a second state (e.g., a low logical level).

Block 220 may generally be followed by block 225, which describes determining if there w as a match for any of the files where the accumulator signal is at a high level. The determination may be made based on the status of the match signals after the comparison operation described in block 220. There may be a signal (e.g., AnyMatchF of FIG. 1) which indicates whether any of the match signals indicate a match or not in the files with accumulator signals at a high logical level. The files associated with accumulator signals at the low logical level may be disqualified from this determination. For example, each of the accumulator circuits may be coupled in common to a signal line carrying Any-MatchF, which is pre-charged to a first level as part of the block 225. Any of the accumulator circuits may change a state of the signal line (and thus AnyMatchF) based on their associated match signal as long as the accumulator signal stored in that accumulator circuit is at a high logical level. If the accumulator signal is at a low level, then it may not affect the status of the signal AnyMatchF whether there is a match or not. The state of the signal line may thus indicate if there was at least one match or not in the files associated accumulator signals which are at a high logical level. If there is not at least one match (e.g., the signal AnyMatchF is high), then block 225 may generally be followed by block 240, as described in more detail herein.

If there w as at least one match (e.g., the signal Any-MatchF is low), then block 225 may generally be followed by block 230, which describes setting the prior match signal to an active level. The control logic may contain a prior match signal which has an active level which indicates that there was at least one match between a stored bit and a comparison bit at least once during the current extremum search operation. In some embodiments, the prior match signal may be a single bit signal (e.g., a flag) with the active level being a high logical level.

Block 230 may generally be followed by block 235, which describes changing the states of accumulator signals based on the match between their associated stored bit and the comparison bit. The accumulator signal for each file may be changed based on if the bit Q(X) in that file matches the comparison bit Compare(X). If there is not a match, the accumulator signal may be changed from a first state to a second state. If there is a match, the accumulator signal may be kept at its current state. Note that once an accumulator signal is in a second state, it is generally not reset to the first state until a new extremum search operation is performed. In some embodiments, the state of the Match signal may be written to the accumulator latch to change the state of the accumulator signal, and logic (e.g., feedback) may be used to prevent the accumulator signal from going back to the first state if it is currently in the second state. Block 235 may generally be followed by block 250. as described in more detail herein.

Returning to block 225, if there is not a match between the comparison bit and the stored bit Q(X) in any of the files, then block 225 may generally be followed by block 240, which describes keeping all accumulator signals at their current levels. When there is not a match in any of the files (e.g., as indicated by the state of the any match signal), all of the accumulator signals may be kept at their current state, even if there is not a match between the match signal Match(Y) and the associated accumulator signal MaxMin (Y).

Block 240 may generally be followed by block 250. Block 235 may also generally be followed by block 250. Block 250 describes determining if the final comparison bit from the sequence of comparison bits has been provided. For example, in block 250 it may be determined if the most recently provided comparison bit was the least significant bit Compare(0) or not. If the final comparison bit has been provided, then it may indicate that the method 200 is done with providing comparison bits, and block 250 may generally be followed by block 270.

If the final comparison bit has not been provided, then block 250 may generally be followed by block 255, which describes providing a next comparison bit in the sequence. For example, if the sequence is counting down from a most significant bit Q(m) to a least significant bit Q(0), and the previous comparison bit was Compare(X), then at block 255. a comparison bit Compare(X−1) may be provided. Block 255 is generally followed by block 215. The loop from blocks 215 to block 255 may generally continue until the method 200 is done providing comparison bits.

Once the method 200 is done providing comparison bits the method 200 may proceed to block 270, which describes determining if the prior match signal is at an active level. If the prior march signal is not at an active level, it may indicate that there was not an operation where there was at least one match for the comparison bit in one of the files. For example, if all of the files contain a number which is 0 (e.g., and therefore ail of their bits are at a low level), and the extremum search operation is looking for a maximum, then no bit will ever match the comparison bit.

If the prior match signal is at an active level (e.g., there was at least one match), block 270 may generally be followed by optional block 260 or if optional block 260 is not performed, may be followed by block 265. Block 260 describes resolving any ties if more than one accumulator signal is in the first state. Accumulator signals which are in the first state may indicate that the associated file contains an extremum value. In some applications it may be desirable to identify only a single file as containing an extremum value. Accordingly, if multiple accumulator signals arc at the first state, during block 260 the control logic circuit and/or accumulator circuits may select one of them and may change the other accumulator signals to the second state. In one example criteria for selecting a single accumulator signal (e.g., for breaking the tie) the file with the highest index (e.g., the File(Y) where Y is closest to the maximum value Y=m) may be chosen. Other criteria may be used in other examples.

Block 260 may generally be followed by block 265, which describes determining the file with the extremum numerical value based on the state of the extremum signals. The control logic circuit may identify the file containing the extremum value based on which one (or more if block 260 was not performed) of the accumulator signals is in a first slate. In some embodiments, the control logic circuit may provide a signal (e.g., YMaxMin of FIG. 1) which indicates an index of which file contains the extremum value. In some embodiments, various actions may be performed on the file containing the extremum value (or on the files not containing an extremum value). For example, after a minimum numerical value in the stack is found, the stack may receive new data and a write signal. Only the accumulator circuit where the accumulator signal is still high (e.g., the minimum value) may pass the write signal on to the CAM cells of the file, and thus only the minimum numerical value may be overwritten.

Returning to block 270. if the prior match signal is not at an active level (e.g., there were no matches), then block 270 may generally be followed by block 275 which describes indicating that no extremum value was determined. For example, block 275 may involve determining that there is no extremum value because all of the count values are equal. In some embodiments, block 275 may involve providing a signal which indicates that the extremum search operation was unsuccessfully concluded (e.g., because all files store an equal count value). In some embodiments, a file may still be indicated as a placeholder, for example by following a procedure similar to the one described in block 260.

Figure 3:
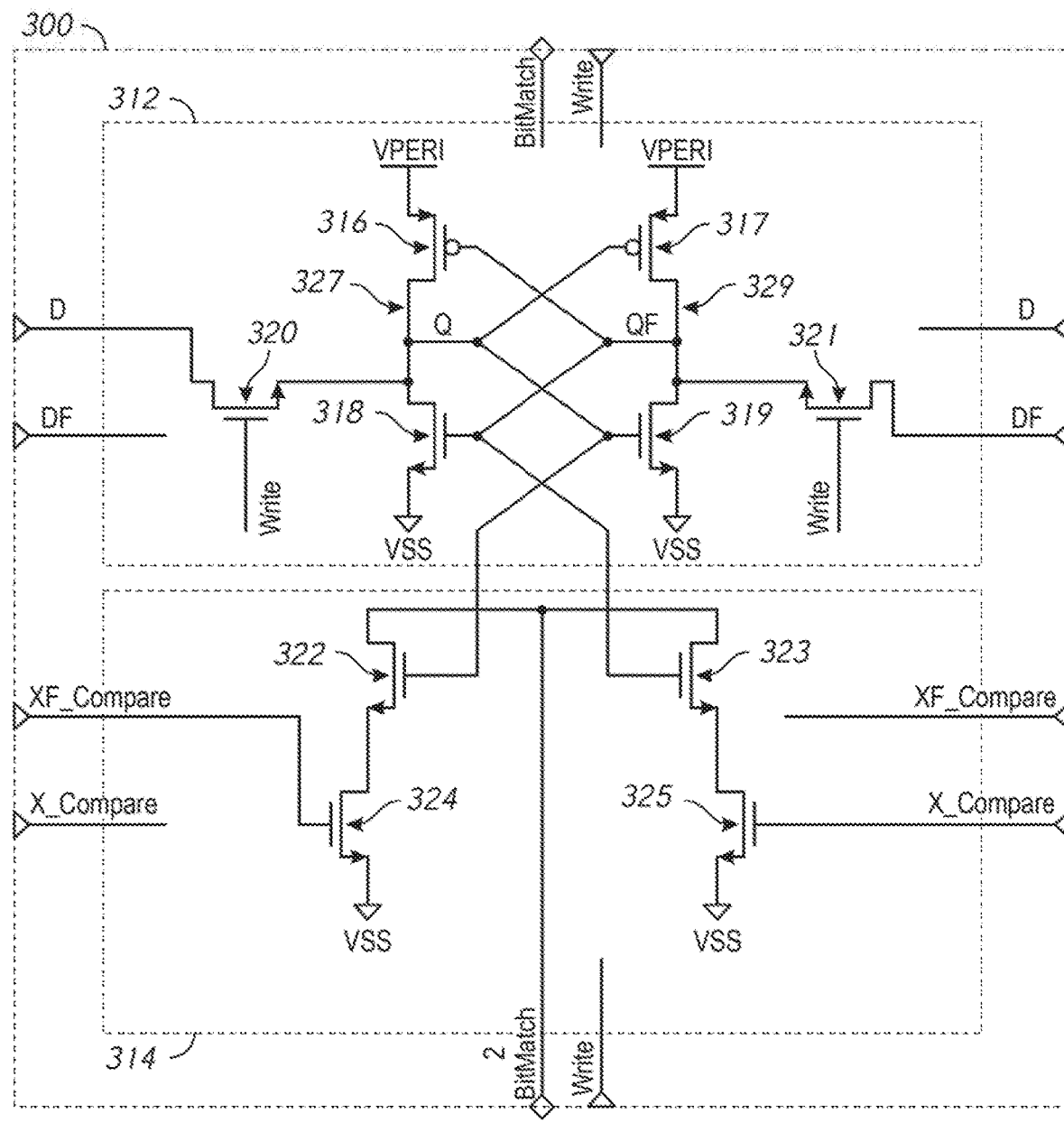
FIG. 3 is a schematic diagram of a CAM cell according to an embodiment of the present disclosure.

FIG. 3 is a schematic diagram of a CAM cell according to an embodiment of the present disclosure. The CAM cell 300 may, in some embodiments, implement the CAM cells 104 of FIG. 1. The CAM cell 300 includes a latch portion 312 and a comparator portion 314. The CAM cell 300 may generally use voltages to represent the values of various bits. The CAM cell 300 may include conductive elements (e.g., nodes, conductive lines) which carry a voltage representing a logical value of that bit. For example, a high logical level may be represented by a first voltage (e.g., a system voltage such as VPERI), while a low logical level may be represented by a second voltage (e.g., a ground voltage, such as VSS).

The latch portion of the CAM cell 300 may store signals Q and QF which represents the state of a stored bit (e.g., Q(X) of FIG. 1). When the CAM cell 300 receives a bit of input data represented by signals D and DF, and a write signal Write, the value of the input data may overwrite the stored bit and become the new stored bit. The CAM cell 300 may receive an external bit (e.g., Compare(X) of FIG. 1) represented by signals X_Compare and XF_Compare and may compare the external bit to the stored bit. Based on that comparison, the CAM cell may change a state of a match signal BitMatch (e.g., Match(Y) of FIG. 1), which may be shared in common with one or more other CAM cells in the same field of a file.

The latch portion 312 includes a first transistor 316 which has a source coupled to a node which provides a voltage VPERI. which may represent a high logical level. The first transistor 316 has a drain coupled to a node 327 having a voltage which represents the value of the signal Q and a gate coupled to a node 329 having a voltage which represents a value of the complementary signal QF. The signal Q represents the logical level of a bit stored in the latch portion 312. The first transistor 316 may be a p-type transistor. The latch portion 312 also includes a second transistor 317 which has a source coupled to the node which provides VPERI, a gate coupled to the node 327 and a drain coupled to the node 329. The second transistor 317 may be a p-type transistor.

The latch portion 312 includes a third transistor 318 which has a drain coupled to the node 327, a gate coupled to the node 329, and a source coupled to a node providing a ground voltage VSS. which may represent a low logical level. The third transistor 318 may be an n-type transistor. The latch portion 312 includes a fourth transistor 319 which has a drain coupled to the node 329, a gate coupled to the node 327, and a source coupled to the node providing the ground voltage VSS. The fourth transistor 319 may be an n-type transistor. The transistors 316 and 318 may form an inverter circuit and the transistors 317 and 319 may form another inverter circuit, and the two inverter circuits are cross-coupled to one another.

In operation, the first, second, third, and fourth transistors 316-319 may work to store the value of the stored signals Q and QF. The transistors 316-319 may work together to couple the node 327 carrying Q and the node 329 carrying QF to a node providing the system voltage (e.g., VPERI or VSS) associated with the value of the signals Q and QF. For example, if the stored signal Q is at a high logical level, then the inverse signal QF is at a low logical level. The first transistor 316 may be active, and VPFRI may be coupled to the node 327. The second transistor 317 and the third transistor 318 may be inactive. The fourth transistor 319 may be active and may couple VSS to the node 329, This may keep the node 327 at a voltage of VPERI, which represents a high logical level, and the node 329 at a voltage of VSS, which represents a low logical level. In another example, if the stored signal Q is at a low logical level, then the inverse signal QF may be at a high logical level. The first transistor 316 and the fourth transistor 319 may both be inactive. The second transistor 317 may be active and may couple VPFRI to the node 329. The third transistor 318 may also be active and may couple VSS to the node 327. In this manner, the stored signal Q and QF may be coupled to a respective system voltage corresponding to their current logical levels, which may maintain the current logical value of the stored bit.

The latch portion 312 also includes a fifth transistor 320 and a sixth transistor 321. The transistors 320 and 321 may act as switches which may couple a signal line which carries input data D and a signal line carrying inverse input data DF to the nodes 327 and 329 carrying Q and QF respectively when a write signal Write is active. Tire fifth transistor 320 has a gate coupled to a line carrying the Write signal, a drain coupled to the signal D, and a source coupled to the node 329. Hie sixth transistor 321 has a gate coupled to the W rite signal, a drain coupled to the signal DF, and a source coupled to the node 329. Accordingly, when the Write signal is at a high level (e.g., at a voltage such as VPERI), the transistors 320 and 321 may be active, and the voltages of the signals D and DF may be coupled to the nodes 327 and 329 carrying Q and QF respectively.

In some embodiments, the first through sixth transistors 316-321 may generally all be the same size as each other. For example, the transistors 316-321 may have a gate width of about 300 nm. Other sizes of transistor 316-321 may be used in other examples. The CAM cell 300 also includes a comparator portion 314 The comparator portion 314 may compare the signals Q and QF to the signals X_Compare and XF_Compare. The signal X_Compare may represent a logical level of an external bit provided to the comparator portion 314. If there is not a match between the signals Q and X_Compare (and therefore between QF and XF_Compare), then the comparator portion 314 may change a state of from the BitMatch signal from a first logical level (e.g., a high logical level) to a second logical level (e.g., a low logical level). For example, if the stored and external bits do not match, the comparator portion 314 may couple the ground voltage VSS to a signal line carrying the signal BitMatch. In some embodiments, if there is a match between the stored and external bits, then the comparator portion 314 may do nothing. In some embodiments, the signal BitMatch may be precharged to a voltage associated with a high logical level (e.g., VPERI) before a comparison operation. During the precharge operation (e.g. block 225 of FIG. 2), both X_Compare and XF_Compare may be held at a low logical level.

The comparator portion includes a seventh transistor 322, an eighth transistors 323, a ninth transistor 324, and a tenth transistor 325. The seventh transistor 322 and the ninth transistor 324 may implement the first portion 101 of FIG. 1. The eighth transistor 323 and the tenth transistor 325 may implement the second portion 103 of FIG. 1. The seventh transistor 322 includes a drain coupled to the signal BitMatch, a gate coupled to the node 327 (e.g., the signal Q), and a source coupled to a drain of the ninth transistor 324. The ninth transistor 324 also has a gate coupled to the signal XF Compare and a source coupled to a signal line providing the ground voltage VSS.

The eighth transistor 323 has a drain coupled to the signal BitMatch, a gate coupled to the node 329 (e.g, the signal QF), and a source coupled to a drain of the tenth transistor 325. The tenth transistor has a gate coupled to the signal X_Compare and a source coupled to the ground voltage VSS.

Since the signal Q is complementary to the signal QF, the comparator portion 312 may operate by comparing the external signal X_Compare to the signal QF to see if they match, and the inverse external signal XF Compare to the stored signal Q to see if they match. If they do match, it may indicate that the signal X_Compare does not match live signal Q and that the signal XF_Compare does not match the signal QF, and thus that the external bits do not match the associated stored bits.

The comparator portion 314 may use relatively few components, since it changes the signal BitMatch from a known state (e.g., a precharged high logical level) to a low logical level. Thus, it may not be necessary to include additional components (e.g., additional transistors) to change the logical level of the signal BitMatch from low to high, or from an unknown level to either low or high. The comparator portion 314 may take advantage of this to provide dynamic logic. For example, the comparator portion 314 has two portions (e.g., transistors 322/324 and transistors 324/325) either of which may couple the signal BitLine to the voltage VSS if there is not a match between the stored and external bit. Since only one of the portions is active at a time, only the state of the signal Q or QF needs to be checked by the active portion. Either of the portions is equally capable of changing the signal BitMatch to a low logical level.

In an example operation, if the stored signal Q is at a high logical level (and thus the signal QF is low) and the external signal X_Compare is also high (and the signal XF_Compare is low), then the external signals may match the stored signals, and the transistors 322 and 325 may be active while the transistors 324 and 323 are inactive. This may prevent the ground voltage VSS from being coupled to the signal BitMatch. If the signal X_Compare is low (e.g., if there is not a match), then the external signals may not match the stored signals, and the transistors 322 and 324 may be active wile transistors 323 and 325 are inactive. The transistors 322 and 324 being active at the same time may couple the ground voltage VSS to the signal BitMatch.

In another example operation if the stored signal Q is low (and thus the signal QF is high) then the transistor 322 may be inactive while the transistor 323 is active. If the external signal X_Compare is low (and XF_Compare is high) then the external signal may match the stored bits, and the transistor 324 is active while transistor 325 is inactive. If the signal X_Compare is high (and the signal XF_Compare is low) then the external signal may not match the stored signal and the transistor 324 may be inactive while the transistor 325 is active. Accordingly, the signal BitMatch may be coupled to ground voltage VSS through active transistors 323 and 325.

In some embodiments, the transistors 322-325 of the comparator portion 314 may generally all have the same size to each other. In some embodiments, the transistors 322-325 of the comparator portion 314 may be a different size than the transistors 316-321 of the latch portions 312. For example, the transistors 322-325 may have a gate width of about 400 nm and a gate length of about 45 nm. Other sizes for the transistors 322-325 may be used in other examples.

Figure 4:
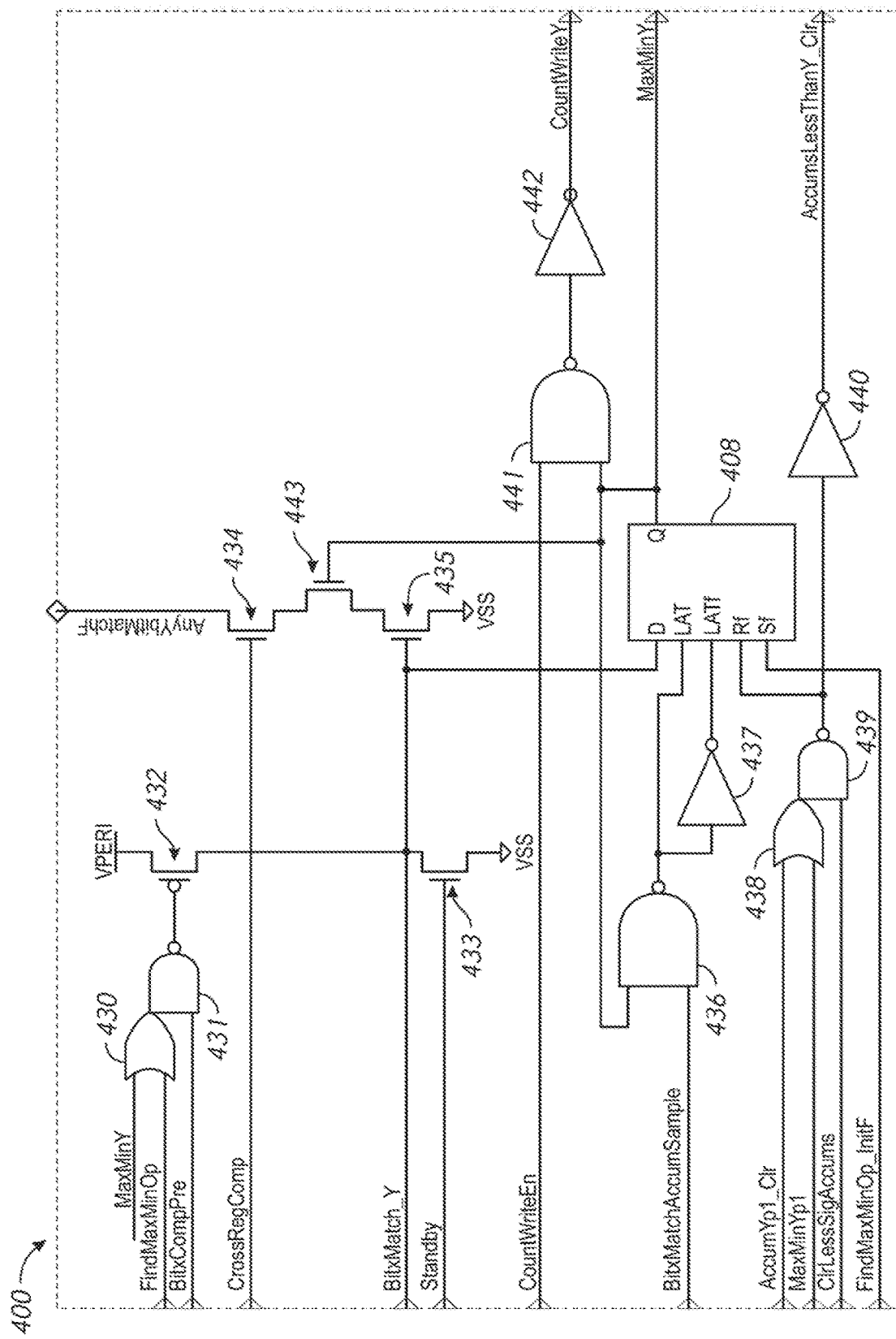
FIG. 4 is a schematic diagram of an accumulator circuit according to an embodiment of the present disclosure.

FIG. 4 is a schematic diagram of an accumulator circuit according to an embodiment of the present disclosure. The accumulator circuit 400 may implement the accumulator circuits 106 of FIG. 1, in some embodiments. The accumulator circuit 400 includes a latch circuit 408 (e.g., accumulator latch 108 of FIG. 1) which stores an accumulator signal MaxMinY which in the case of the example accumulator circuit 400 of FIG. 4 is an accumulator bit. The latch circuit 408 may provide a signal MaxMinY (e.g., accumulator signal MaxMin(Y) of FIG. 1) based on rite stored accumulator bit. The accumulator circuit 400 may receive a variety of inputs and control signals which be used to determine the state of the accumulator signal stored in the latch circuit 408 during an extremum search operation.

The accumulator circuit 400 receives a control signal BitxCompPre from a control logic circuit (e.g., control logic circuit 110 of FIG. 1) in common with all the other accumulator circuits. The signal BitxCompPre may be used as part of a pre-charge operation (e.g., block 215 of FIG. 2) to pre-charge a node carrying a match signal BitxMatch_Y to a high voltage level before each comparison. The match signal BitxMatch_Y may implement the match signal Match (Y) of FIG. 1 and/or BitMatch of FIG. 3 in some embodiments. Accordingly, the control logic circuit may provide the signal BitxCompPre at a high logic level (e.g., a high voltage) each time a comparison operation is performed (e.g., each time a comparison bit is provided to the files of the stack). The signal BitxCompPre may be 'pulsed' by the control logic (e.g., briefly provided at a high level and then returned to a low level) in order to pre-charge the node carrying the match signal BitxMatch_Y.

It may also be desirable to prevent the node carrying the signal BitxMatch_Y from floating between operations. The control signal Standby may be used to indicate that a comparison operation is not currently being performed. The signal Standby may be provided in common to all of the accumulator circuits of the stack. Accordingly the control logic circuit may provide a pulse of the signal BitxCompPre when a comparison operation is about to be performed, and the signal Standby when a comparison operation is not being performed. During the comparison operation the state of the node carrying the signal BitxMatch_Y may be allowed to change (e.g., neither BitxCompPre or Standby is active).

A node carrying the signal Standby is coupled to the gate of a transistor 433, which has a source coupled to a ground voltage (e.g., VSS) and a drain coupled to the node carrying the match signal BitxMatch_Y. The transistor 433 may be an n-type transistor. Accordingly, when the signal Standby is provided, the transistor 433 is active, and the node carrying the signal BitxMatch_Y is coupled to ground to prevent it from floating.

In one embodiment, not shown in FIG. 4. the signal BitxCompPre may be coupled through an inverter circuit to the gate of a transistor 432. The source of the transistor 432 is coupled to a system voltage (e.g., VPERI) higher than the ground voltage VSS, and the drain of the transistor 432 is coupled to the node carrying the match signal BitxMatch_Y. The transistor 432 may be a p-type transistor. Accordingly, in this embodiment, when the signal BitxCompPre is provided at a high level, the transistor 432 may be active and may couple the node carrying BitxMatch_Y to the system voltage, pre-charging it.

In some embodiments, such as the one shown in FIG. 4, it may be desirable to allow only the file which contains the extremum to be pre-charged for a comparison operation. For example, after an extremum value is found, it may be useful to compare an external numerical value only to the file containing the extremum value. In order to achieve this functionality, the signal BitxCompPre is coupled to one of the input terminals of a NAND gate 431. The other input terminal of the NAND gate 431 may be coupled to the output terminal of an OR gate 430. which has an input terminal coupled to a control signal FindMaxMinOp and the accumulator signal MaxMinY, The control signal FindMaxMinOp may be provided in common to all of the accumulator circuits in the stack. The accumulator signal MaxMinY is the value stored in the latch circuit 408 of the particular accumulator circuit 400. and thus the value of the accumulator signal MaxMinY may be different in different accumulator circuits.

When it is desirable to pre-charge all of the match signals BitxMatch_Y across the depth of the stack, the signal FindMaxMinOp may be pulsed at the same time that the signal BitxCompPre is pulsed. Accordingly, the OR gate 430 may provide a high logic output, and thus both the inputs of the NAND gate 431 may be at a high level, causing it to return a low logic level signal to activate the transistor 432.

If it is desirable to only pre-charge the node carrying the match signal in the file(s) which have an extremum value, the signal FindMaxMinOp may be kept at a low level (e.g., not provided) when the signal BitxCompPre is pulsed. The state of the accumulator signal MaxMinY may determine if the accumulator circuit 400 for a particular file charges the signal line carrying the match signal BitxMatch_Y or not. If the accumulator signal MaxMinY is at a high level (e.g., indicating that the accumulator circuit is associated with a file containing an extremum numerical value) then the match signal BitxMatchY may be pre-charged when the signal BitxCompPre is pulsed. If the accumulator signal is at a low level (e.g., indicating that the accumulator circuit is not associated with an extremum value) then the match signal BitxMatch_Y is not pre-charged. In some embodiments, the signal FindMaxMinOp may be omitted, and since the signal MaxMinY is initially set to a high level, the signal MaxMinY may function (along with BitxCompPre) to activate the transistor 432.

As discussed in FIGS. 1-3, after the signal line carrying the match signal BitxMatch_Y is pre-charged, a comparison operation may be performed where a comparison bit is provided and compared to one of the hits in the file coupled to the accumulator circuit 400. After the comparison operation the node carrying the match signal BitxMatch_Y may have a voltage indicating the result of the comparison, either a high voltage (e.g., VPHRI) if the comparison bit matched the stored bit, or a low voltage (e.g, VSS) if there was not a match. The node carrying the match signal BitxMatch_Y is coupled to the input terminal D of the latch circuit 408. The value of the match signal BitxMatch_Y may be saved as the value of the accumulator signal stored in the latch circuit 408. when the latch terminals LAT and LATf of the latch circuit 408 are triggered.

The accumulator circuit 400 receives a control signal BitxMatchAccumSample in common with the other accumulator circuits. The control logic circuit may pulse the signal BitxMatchAccumSample after each of the comparison operations (e.g., a delay time after pulsing the signal BitxCompPre). The control signal BitxMatchAccumSample may determine, in part, if and when the latch circuit 408 captures the value of the match signal BitxMatch_Y and saves it as the value of the accumulator signal MaxMinY.

The signal BitxMatchAccumSample is coupled to an input terminal of a NAND gate 436. The other input terminal of the NAND gate 436 is coupled to a node carrying the accumulator signal MaxMinY stored in the latch. When the signal BitxMatchAccumSample is pulsed, the current value of the match signal BitxMatch_Y may only be captured in the latch circuit 408 if the current value of the accumulator signal MaxMinY is still at a high level. If the accumulator signal MaxMinY has been changed to a low level (e.g., due to a previous comparison operation resulting in a non-match) then the latch circuit 408 will be prevented front capturing future values of the match signal BitxMatch_Y. The NAND gate 436 has an output terminal coupled to the latch input LAT of the latch circuit 408 and also coupled to the inverting latch input LATf through an inverter circuit 437.

The latch circuit 408 has a set input Sf coupled to a control signal FindMaxMinOp_InitF. The signal FindMaxMinOp_InitF may be coupled in common to all of the accumulator circuits of the stack. The signal FindMaxMinOp_InitF may be used to set all of the latch circuits 408 in the different accumulator circuits to store a high level as the accumulator signal MaxMinY before an extremum search operation (e.g., as part of block 205 of FIG. 2). The signal FindMaxMinOp_InitF may be pulsed from a high level to a low level, and then back to a high level. This may cause all of the latch circuits 408 to be set to store a high level before beginning the extremum search operation. Since all latch circuits 408 are initialized to storing a high level as the accumulator signal, all of the latch circuits 408 may initially be responsive to the signal BitxMatchAccumSample until the latch is disqualified by the match signal BitxMatch_Y being at a low level after a comparison operation.

All of the accumulator circuits may be coupled in common to a signal line carrying the signal AnyYbitMatchF, which may be the signal AnyMatchF of FIG. 1 in some embodiments. The signal AnyYbitMatchF may indicate if any of the match signals BitxMatch_Y were at a high logical level after the comparison operation. In some embodiments, the state of the signal AnyYbitMatchF may be determined using dynamic logic (e.g., similar to the match signal BitMatch of FIG. 2). For example, after each comparison operation, the signal AnyYbitMatchF may be pre-changed to a high level (e.g., a system voltage such as VPER1) and each of the accumulator circuits 400 may be capable of changing the state of the signals AnyYbitMatchF to a low level if the match signal BitxMatch_Y of that file is at a high level (e.g., indicating a match) after the comparison operation.

The signal line carrying the signal AnyYbitMatchF may be coupled to a driver circuit (not shown) which may pre-charge the signal line before a comparison operation. The driver circuit may pre-charge the signal line responsive to a control signal CrossRegCompPreF provided by the control logic. The signal CrossRegCompPreF may be pulsed to a low level to pre-charge the signal line carrying AnyYbitMatchF. In some embodiments, the driver circuit may include a transistor with a gate coupled to CrossRegCompPreF, a source coupled to a system voltage such as VPERI, and a drain coupled to the signal line carrying AnyYbitMatchF. The transistor may be a p-type transistor such that when the signal CrossRegCompPreF is pulsed low, the transistor is active and couples the signal line to VPERI to pre-charge it.

Each of the accumulator circuits 400 has a transistor 434 with a source coupled to the signal line carrying AnyYbitMatchF and a drain coupled to the source of a transistor 443. The drain of the transistor 443 is coupled to a source of a transistor 435. The drain of the transistor 435 is coupled to a ground voltage (e.g., VSS). The transistors 434, 435, and 443 may be n-type transistors. The gate of the transistor 434 is coupled to a control signal CrossRegComp, which may be provided in common to all of the accumulator circuits. The signal CrossRegComp may be pulsed to a high level by the control logic to determine if any of the match signals BitxMatchY are at a high level after the comparison operations (e.g., as part of block 225 of FIG. 2). The gate of the transistor 443 is coupled to the signal MaxMinY. The gate of the transistor 435 is coupled to the node carrying the match signal BitxMatch_Y. Accordingly, when the signal CrossRegComp is pulsed, the transistor 434 is activated. If the match signal BitxMatch_Y is high, the transistor 435 is activated. If the accumulator signal MaxMinY is at a high level, then the transistor 443 is active. If all of the transistors 434, 435, and 443 are activated, the signal line carrying AnyYbitMatchF is coupled to the ground voltage VSS. Accordingly, the state of the signal AnyYbitMatchF may only be changed if the accumulator signal MaxMinY is at a high level, the match signal BitxMatch_Y is at a high level, and the command signal CrossRegComp is provided.

For each comparison operation during an extremum search operation, the signal line AnyYbitMatchF may be pro-charged to a high level, and may be pulled to a low level if any of the match signals BitxMatch_Y is at a high level (e.g., indicating a match). The control logic circuit may use the state of the signal Any YbitMatchF to determine if the state(s) of the accumulator signals should be changed (e.g., as described in blocks 225-245 of FIG. 2). For example, responsive to the signal AnyYbitMatchF being at a low level (e.g., indicating at least one match), the control logic may provide a pulse of the signal BitXMatchAccumSample. Responsive to the signal AnyYbitMatchF being at a high level (e.g., indicating no matches) the control logic may skip providing the signal BitXMatchAccumSample for the given comparison operation.

In some embodiments, the different accumulator circuits 400 may be connected together in a 'daisy chain' fashion. This may allow the accumulator circuits 400 and the control logic circuit to work together to resolve any ties so that only one accumulator latch 408 in one of the accumulator circuits 400 holds a high value. For example, the accumulator circuits 400 may receive in common a control signal ClrLessSigAccums which indicates that ties should be resolved. Each accumulator circuit 400 may also receive signals AccumYp1_Clr and MaxMinYp1 from a previous accumulator circuit 400. The signal MaxMinYp1 may be the accumulator signal MaxMinY of the previous accumulator circuit. The signal AccumYp1_Clr may be a signal AccumsLessThanY_Clr (which will be described herein) from a previous accumulator circuit.

The accumulator circuit includes an OR gate 438 with an input terminal coupled to the signal AccumYp1_Clr and an input terminal coupled to the signal MaxMinYp1. The output terminal of the OR gate 438 is coupled to one of the input terminals of a NAND gate 439. The other input terminal of NAND gate 439 is coupled to the control signal ClrLessSigAccums. A first accumulator circuit in the daisy chain may have the inputs AccumYp1_Clr and MaxMinYp1 coupled to a ground voltage to initialize the signal. When the control signal ClrLessSigAccums is pulsed, if either AccumYp1_Clr or MaxMinYp1 is at a high level, the inverting reset terminal Rf of the latch circuit 408 may receive a low signal (e.g., a ground voltage) from the NAND gate 439 and may reset the value stored in the latch circuit 408 (e.g., the signal MaxMinY to a low level). The output terminal of the NAND gate 439 is passed through an inverter circuit 440 to become the signal AccumsLessThanY_Clr which is provided to the next accumulator circuit in the daisy chain (e.g., to become the signal AccumYp1_Clr).

The direction the accumulator circuits 400 are coupled together may determine the criteria used to break the tie. For example, an accumulator circuit associated with File(Y) may receive the signals AccumYp1_Clr and MaxMinYp1 from an accumulator circuit associated with File(Y+1) and so on. This may cause any tie to broken in favor of the accumulator circuit with the highest index. Note that in some embodiments, the accumulator circuits may be daisy chained in the opposite direction (e.g., File(0) may provide signals to File(1)) and it only changes the direction in which ties are broken (e.g., from lowest numbered register to highest numbered register).

In an example operation, after alt the comparison bits have been provided (e.g., at block 260 of FIG. 2), there may be 3 accumulator circuits which are each storing a respective accumulator signal: MaxMin2 is high; MaxMin1 is low; MaxMin0 is high. In this example the accumulator circuits are daisy chained from highest to lowest index. When the signal ClrLessSigAccums is pulsed, the first accumulator circuit may receive low logical inputs on both AccumYp1_Clr and MaxMinYp1 (since that is how those signals are initialized). Accordingly the accumulator signal MaxMin2 is not reset, and remains at a high value. The second accumulator receives the signals AccumYp1_Clr at a low logical level (since the previous accumulator circuit was not reset) and receives MaxMinYp1 at a high level since MaxMinYp1=MaxMin2. Accordingly, the second accumulator circuit receives a reset signal (e.g., the output of the NAND gate 439 is at a low level) however the accumulator signal MaxMin1 was already at a low level, and remains at a low level. The third accumulator circuit receives the signal AccumYp1_Clr at a high level (since the previous circuit did receive a reset signal even if it didn't change anything) and MaxMinYp1 at a low level (e.g., since MaxMin1 is low). Accordingly, the third accumulator circuit may reset (since at least one of AccumYp1_Clr and MaxMinYp1 is high) and the third accumulator signal MaxMin0 may change to a low level. Thus, after the signal ClrLessSigAccums is pulsed, MaxMin2 is high, MaxMin1 is low and MaxMin0 is low.

In some embodiments, the accumulator circuit 400 may control whether data can be written to the associated file based on the state of the accumulator signal. Each of the accumulator circuits 400 may receive in common a signal CountWriteEn which may be coupled to the input terminal of a NAND gate 441. The other input terminal of the NAND gate 441 may be coupled to the output terminal Q of the latch circuit 408 which provides the accumulator signal MaxMinY. The NAND gate 441 may provide a signal through an inverter circuit 442 which is CountWriteY. The signal CountWriteY may be a write signal (e.g., the signal Write of FIG. 3) which indicates that the values in the register may be overwritten. Due to the NAND gate 441 and inverter 442. when the signal CountWriteEn is provided, the signal CountWriteY may only be at a high level for accumulator circuits which are storing an accumulator signal that is at a high logical level (e.g., indicating an extremum value).

An example environment where it may be useful to store numerical values and identify extremum values are semiconductor memory devices. Memory devices may be used to store one or more bits of information in a memory cell array, which contains a plurality of memory cells each of which includes one or more bits of information. The memory cells may be organized at the intersection of rows (word lines) and columns (bit lines). During various operations, the memory1 device may access one or more memory cells along specified word lines or bit lines by providing a row and/or column address which specifies the word line(s) and bit line(s).

An example application for the stacks, accumulator circuits, and control logic circuit of the present disclosure are refresh operations in a memory device. Information in the memory cells may decay over time, and may need to be periodically refreshed (e.g., by rewriting the original value of the information to the memory cell). Repeated access to a particular row of memory (e.g., an aggressor row) may cause an increased rate of decay in neighboring rows (e.g., victim rows) due. for example, to electromagnetic coupling between the rows. This may generally be referred to as 'hammering' the row, or a row hammer event. In order to prevent information from being lost due to row hammering, it may be necessary to identify aggressor row s so that the corresponding victim rows can be refreshed (a 'row hammer refresh' or RHR). The row addresses of accessed rows may be stored and may be compared to new row addresses to determine if one or more rows requires an RHR operation.

Access counts to different rows of the memory may be stored in a stack, such as the stack 100 described in FIG. 1. A row address may be stored in one field of each file, while a count value associated with that row address may be stored in another field of that file. Each time the row address is accessed, its count value may be updated (e.g., incremented). Based on the count value, victim rows associated with the stored row address may be refreshed. For example, a maximum count value may be selected by performing an extremum search operation (e.g., as described in FIG. 2) for a maximum value. The victim rows associated with the aggressor row associated with the maximum value may then be refreshed. In another example, in some situations, a row address in the stack may need to be replaced, and an extremum search operation to find a minimum value in the stack may be performed, and the row address associated with that minimum value may be overwritten. The functionality described in FIG. 4 where a write signal is only supplied to the file associated with the extremum value may be useful in this example.

Figure 5:
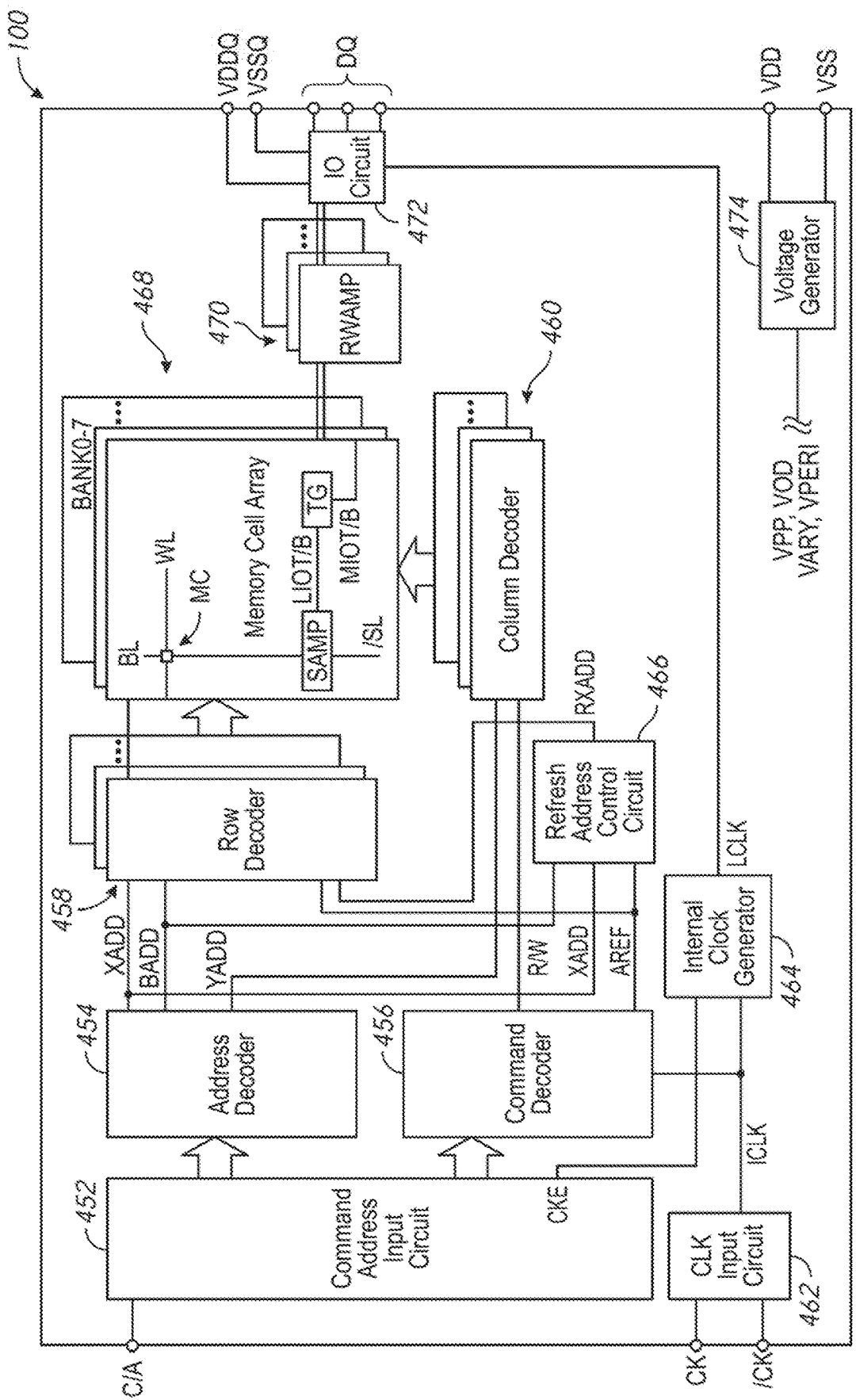
FIG. 5 is a block diagram showing an overall configuration of a semiconductor device according to at least one embodiment of the disclosure.

FIG. 5 is a block diagram showing an overall configuration of a semiconductor device according to at least one embodiment of the disclosure. The semiconductor device 500 may be a semiconductor memory device, such as a DRAM device integrated on a single semiconductor chip.

The semiconductor device 500 includes a memory array 568. The memory array 568 is shown as including a plurality of memory banks. In the embodiment of FIG. 1, the memory array 568 is shown as including eight memory banks BANK0-BANK7. More or fewer banks may be included in the memory array 568 of other embodiments. Each memory bank includes a plurality of word lines WL, a plurality of bit lines BL and BL, and a plurality of memory cells MC arranged at intersections of the plurality of word lines WL and the plurality of bit lines BL and /BL. The selection of the word line WL is performed by a row decoder 558 and the selection of the bit lines BL and /BL is performed by a column decoder 560. In the embodiment of FIG. 1, the row decoder 558 includes a respective row decoder for each memory bank and the column decoder 560 includes a respective column decoder for each memory bank. The bit lines BL and /BL are coupled to a respective sense amplifier (SAMP). Read data from the bit line BL or /BL is amplified by the sense amplifier SAMP, and transferred to read write amplifiers 570 over complementary local data lines (LIOT/B). transfer gate (TG), and complementary main data lines (MIOT/B). Conversely, write data outputted from the read/write amplifiers 570 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 500 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that arc provided to an input circuit 562. The external clocks may be complementary. The input circuit 562 generates an internal clock ICLK based on the CK and /CK clocks. The ICLK clock is provided to the command decoder 560 and to an internal clock generator 564. The internal clock generator 564 provides various internal clocks LCLK based on the ICLK clock. The LCLK clocks may be used for timing operation of various internal circuits. The internal data clocks LCLK are provided to the input/output circuit 572 to time operation of circuits included in the input/output circuit 572, for example, to data receivers to time the receipt of write data.

The C/A terminals may be supplied with memory addresses. The memory addresses supplied to the C/A terminals are transferred, via a command/address input circuit 552, to an address decoder 554. The address decoder 554 receives the address and supplies a decoded row address XADD to the row decoder 558 and supplies a decoded column address YADD to the column decoder 560. The address decoder 554 may also supply a decoded bank address BADD, which may indicate the bank of the memory array 568 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 556 via the command/address input circuit 552. The command decoder 556 includes circuits to decode the internal command signals to generate various internal signals and commands for performing operations. For example, the command decoder 556 may provide a row command signal to select a word line and a column command signal to select a bit line.

The device 500 may receive an access command which is a read command. When a read command is received, and a bank address, a row address and a column address are timely supplied with the read command, read data is read from memory cells in the memory array 568 corresponding to the row address and column address. The read command is received by the command decoder 556, which provides internal commands so that read data from the memory array 568 is provided to the read/write amplifiers 570. The read data is output to outside from the data terminals DQ via the input/output circuit 572.

The device 500 may receive an access command which is a write command. When the write command is received, and a bank address, a row address and a column address are timely supplied with the write command, write data supplied to the data terminals DQ is written to a memory cells in the memory array 568 corresponding to the row address and column address. The write command is received by the command decoder 556, which provides internal commands so that the write data is received by data receivers in the input/output circuit 572. Write clocks may also be provided to the external clock terminals for timing the receipt of the write data by the data receivers of the input/output circuit 572. The write data is supplied via the input/output circuit 572 to the read/write amplifiers 570. and by the read/write amplifiers 570 to the memory array 568 to be written into the memory cell MC.

The device 500 may also receive commands causing it to carry out refresh operations. The refresh signal AREF may be a pulse signal which is activated when the command decoder 556 receives a signal which indicates an auto-refresh command. In some embodiments, the auto-refresh command may be externally issued to the memory device 500. In some embodiments, the auto-refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 566. The refresh address control circuit 566 supplies a refresh row address RXADD to the row decoder 558, which may refresh a wordline WL indicated by the refresh row address RXADD. The refresh address control circuit 566 may control a timing of the refresh operation, and may generate and provide the refresh address RXADD. The refresh address control circuit 566 may be controlled to change details of the refreshing address RXADD (e.g., how the refresh address is calculated, the timing of the refresh addresses), or may operate based on internal logic.

The refresh address control circuit 566 may selectively output a targeted refresh address (e.g., a victim address) or an automatic refresh address (auto-refresh address) as the refreshing address RXADD. The automatic refresh addresses may be a sequence of addresses which are provided based on activations of the auto-refresh signal AREF. The refresh address control circuit 566 may cycle through the sequence of auto-refresh addresses at a rate determined by AREF.

The refresh address control circuit 566 may also determine targeted refresh addresses which are addresses that require refreshing (e.g., victim addresses corresponding to victim rows) based on the access pattern of nearby addresses (e.g., aggressor addresses corresponding to aggressor rows) in the memory array 568. The refresh address control circuit 566 may selectively use one or more signals of the device 500 to calculate the targeted refresh address RXADD. For example, the refresh address RXADD may be calculated based on the row addresses XADD provided by the address decoder. The refresh address control circuit 566 may sample the current value of the row address XADD provided by the address decoder 554 and determine a targeted refresh address based on one or more of the sampled addresses.

The refresh address RXADD may be provided with a timing based on a timing of the refresh signal AREF. The refresh address control circuit 566 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh address control circuit 566 may determine whether to provide a targeted refresh address, not provide an address during that time slot, or provide an auto-refresh address instead during the time slot.

The targeted refresh address may be based on characteristics over time of the row addresses XADD received from the address decoder 554. The refresh address control circuit 566 may sample the current row address XADD to determine its characteristics over time. The sampling may occur intermittently, with each sample acquired based on a random or semi-random timing. Access counts associated with the received row addresses XADD may be stored in a stack (e.g., the stack 100 of FIG. 1). In some embodiments, access counts which exceed a threshold may have their victim addresses calculated and refreshed. In some embodiments, an extremum search operation (e.g., as described in FIG. 2) may be performed and an address with a maximum access count may be identified as an aggressor.

The refresh address control circuit 566 may use different methods to calculate a targeted refresh address based on the sampled row address XADD. For example, the refresh address control circuit 566 may determine if a given row is an aggressor address, and then calculate and provide addresses corresponding to victim addresses of the aggressor address as the targeted refresh address. In some embodiments, more than one victim address may correspond to a given aggressor address. In this case the refresh address control circuit may queue up multiple targeted refresh addresses, and provide them sequentially when it determines that a targeted refresh address should be provided. The refresh address control circuit 566 may provide the targeted refresh address right away, or may queue up the targeted refresh address to be provided at a later time (e.g., in the next time slot available for a targeted refresh).

The power supply terminals are supplied with power supply potentials VDD and VSS. The power supply potentials VDD and VSS are supplied to an internal voltage generator circuit 574. The internal voltage generator circuit 574 generates various internal potentials VPP, VOD, VARY, VPERI, and the like based on the power supply potentials VDD and VSS supplied to the power supply terminals. The internal potential VPP is mainly used in the row decoder 558, the internal potentials VOD and VARY are mainly used in the sense amplifiers SAMP included in the memory array 568, and the internal potential VPERI is used in many peripheral circuit blocks.

The power supply terminals are also supplied with power supply potentials VDDQ and VSSQ. The power supply potentials VDDQ and VSSQ are supplied to the input/output circuit 572. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 572 so that power supply noise generated by the input/output circuit 572 does not propagate to the other circuit blocks.

Figure 6:
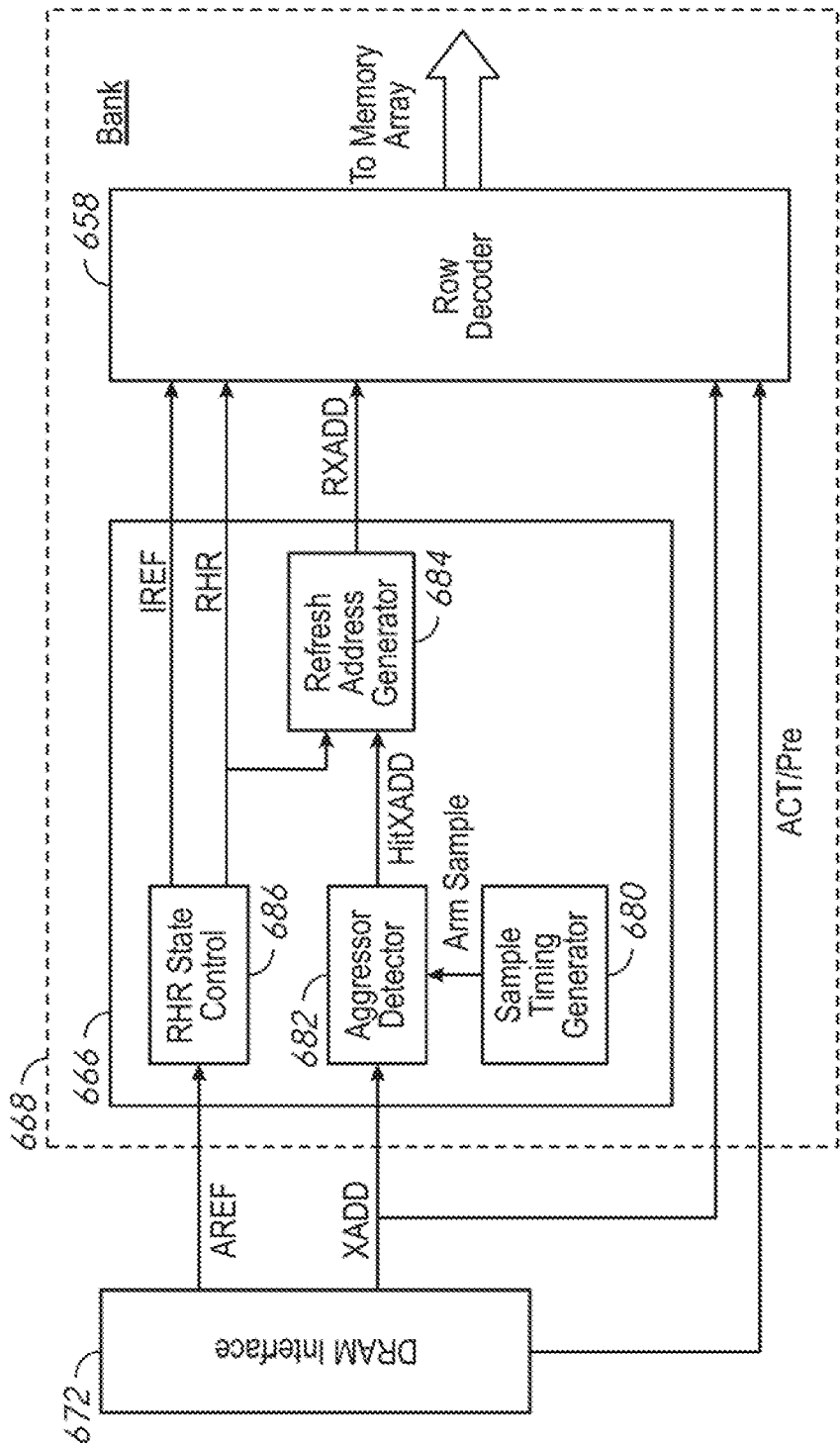
FIG. 6 is a block diagram of a refresh address control circuit according to an embodiment of the present disclosure.

FIG. 6 is a block diagram of a refresh address control circuit according to an embodiment of the present disclosure. The dotted line is shown to represent that in certain embodiments, each of the components (e.g., the refresh address control circuit 666 and row decoder 658) may correspond to a particular bank 668 of memory, and that these components may be repeated for each of the banks of memory. In some embodiments, the components shown within the dotted line may be positioned in each of the memory banks 668. Thus, there may be multiple refresh address control circuits 666 and row decoders 658. For the sake of brevity, only components for a single bank will be described.

A DRAM interface 676 may provide one or more signals to an address refresh control circuit 676 and row decoder 658. The refresh address control circuit 666 may include a sample timing generator 680, an aggressor detector circuit 682, a row hammer refresh (RHR) state control 686 and a refresh address generator 684. Tire DRAM interface 676 may provide one or more control signals, such as an auto-refresh signal AREF, and a row address XADD. The optional sample timing generator 680 generates a sampling signal ArmSample.

In some embodiments, the aggressor detector circuit 682 may receive each row address XADD associated with each access operation. In some embodiments, the aggressor detector circuit 682 may sample the current row address XADD responsive to an activation of ArmSample.

The aggressor detector circuit 682 may store the received row address XADD and determine if the current row address XADD is an aggressor address based on one or more previously stored addresses. The aggressor detector circuit 682 may include a stack (e.g., such as the stack 100 of FIG. 1) which stores the row addresses and also access counts (e.g., numerical values) associated with those row addresses. The aggressor detector circuit 682 may provide one or more of the stored addresses to the refresh address generator 684 as the match address HitXADD based on their associated count values.

The RHR state control 686 may control the timing of targeted refresh operations. Hie RHR state control 686 may provide the signal RHR to indicate that a row hammer refresh (e.g., a refresh of the victim rows corresponding to an identified aggressor row) should occur. The RHR state control 686 may also provide an internal refresh signal IREF, to indicate that an auto-refresh should occur. Responsive to an activation of RHR. the refresh address generator 684 may provide a refresh address RXADD, which may be an auto-refresh address or may be one or more victim addresses corresponding to victim rows of the aggressor row corresponding to the match address HitXADD. The row decoder 658 may perform a targeted refresh operation responsive to the refresh address RXADD and the row hammer refresh signal RHR. The row decoder 658 may perform an auto-refresh operation based on the refresh address RXADD and the internal refresh signal IREF. In some embodiments, the row decoder 658 may be coupled to the auto-refresh signal AREF provided by the DRAM interface 676, and the internal refresh signal IREF may not be used.

The DRAM interface 676 may represent one or more components which provides signals to components of the bank 668. In some embodiments, the DRAM interlace 676 may represent a memory controller coupled to the semiconductor memory device (e.g., device 600 of FIG. 1). In some embodiments, the DRAM interlace 676 may represent components such as the command address input circuit 652, the address decoder 654, and/or the command decoder 656 of FIG. 1. The DRAM interface 676 may provide a row address XADD, the auto-refresh signal AREF, an activation signal ACT, and a precharge signal Pre. The auto-refresh signal AREF may be a periodic signal which may indicate when an auto-refresh operation is to occur. The activation signal ACT may be provided to activate a given bank 668 of the memory. The row address XADD may be a signal including multiple bits (which may be transmitted in series or in parallel) and may correspond to a specific row of a memory bank (e.g., the memory bank activated by ACT/Pre).

In the example embodiment of FIG. 6, the aggressor detector circuit 600 uses a sampling signal ArmSample to determine when the aggressor detector circuit 682 should check a value of the row address XADD. The sample timing generator 680 provides the sampling signal ArmSample which may alternate between a low logic level and a high logic level. An activation of ArmSample may be a 'pulse', where ArmSample is raised to a high logic level and then returns to a low logic level. The sample timing generator 680 may provide a sequence of pulses of ArmSample. Each pulse may be separated from a next pulse by a time interval. The sample timing generator 680 may randomly (and/or semi-randomly and/or pseudo-randomly) vary the time interval.

The aggressor detector circuit 682 may receive the row address XADD from live DRAM interface 676 and ArmSample from the sample timing generator 680. The row address XADD may change as the DRAM interface 676 directs access operations (e.g., read and write operations) to different rows of the memory cell array (e.g., memory cell array 118 of FIG. 1), Each time the aggressor detector circuit 682 receives an activation (e.g., a pulse) of ArmSample, the aggressor detector circuit 682 may sample the current value of XADD.

Responsive to an activation of ArmSample, the aggressor detector circuit 682 may determine if one or more rows is an aggressor row based on the sampled row address XADD. and may provide identified aggressor rows as the match address HitXADD. As part of this determination, the aggressor detector circuit 682 may record (e.g., by latching and/or storing in a stack) the current value of XADD responsive to the activation of ArmSample. The current value of XADD may be compared to previously stored addresses in the aggressor detector circuit 682 (e.g., the addresses stored in the stack), to determine access patterns over time of the sampled addresses. If the aggressor detector circuit 682 determines that the current row address XADD is being repeatedly accessed (e.g., is an aggressor row), the activation of ArmSample may also cause the aggressor detector circuit 682 to provide the address of the aggressor row as a match address HitXADD. fat some embodiments, the match address (e.g., aggressor address) HitXADD may be stored in a latch circuit for later retrieval by the refresh address generator 684.

For example, the aggressor detector circuit 682 may store the value of sampled addresses in a stack, and may have a counter associated with each of the stored addresses. When ArmSample is activated, if the current row address XADD matches one of the stored addresses, the value of the counter may be updated (e.g., incremented). Responsive to the activation of ArmSample. the aggressor detector circuit 682 may provide the address associated with the maximum value counter as the match address HitXADD. An extremum search operation (e.g., as described in FIG. 2) may be used to identify the maximum value. Other methods of identifying aggressor addresses may be used in other examples.

The RHR state control 686 may receive the auto-refresh signal AREF and provide the row hammer refresh signal RHR. The auto-refresh signal AREF may be periodically generated and may be used to control the timing of refresh operations. The memory device may carry out a sequence of auto-refresh operations in order to periodically refresh the rows of the memory device. The RHR signal may be generated in order to indicate that the device should refresh a particular targeted row (e.g., a victim row) instead of an address from the sequence of auto-refresh addresses. The RHR state control 686 may use internal logic to provide the RHR signal. In some embodiments, the RHR state control 686 may provide the RHR signal based on certain number of activations of AREF (e.g., every $4^{th}$ activation of AREF). The RHR state control 686 may also provide an internal refresh signal IREF, which may indicate that an auto-refresh operation should take place. In some embodiments, the signals RHR and IREF may be generated such that they are not active at the same time (e.g., are not both at a high logic level at the same rime).

The refresh address generator 684 may receive the row hammer refresh signal RHR and the match address HitXADD. The match address HitXADD may represent an aggressor row. The refresh address generator 684 may determine the locations of one or more victim rows based on the match address HitXADD and provide them as the refresh address RXADD. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples.

The refresh address generator 684 may determine the value of the refresh address RXADD based on the row hammer refresh signal RHR. In some embodiments, when the signal RHR is not active, the refresh address generator 684 may provide one of a sequence of auto refresh addresses. When the signal RHR is active, the refresh address generator 684 may provide a targeted refresh address, such as a victim address, as the refresh address RXADD.

The row decoder 658 may perform one or more operations on the memory array (not shown) based on the received signals and addresses. For example, responsive to the activation signal ACT and the row address XADD (and 1REF and RHR being at a low logic level), the row decoder 658 may direct one or more access operations (for example, a read operation) on the specified row address XADD. Responsive to the RHR signal being active, the row decoder 658 may refresh the refresh address RXADD.

Figure 7:
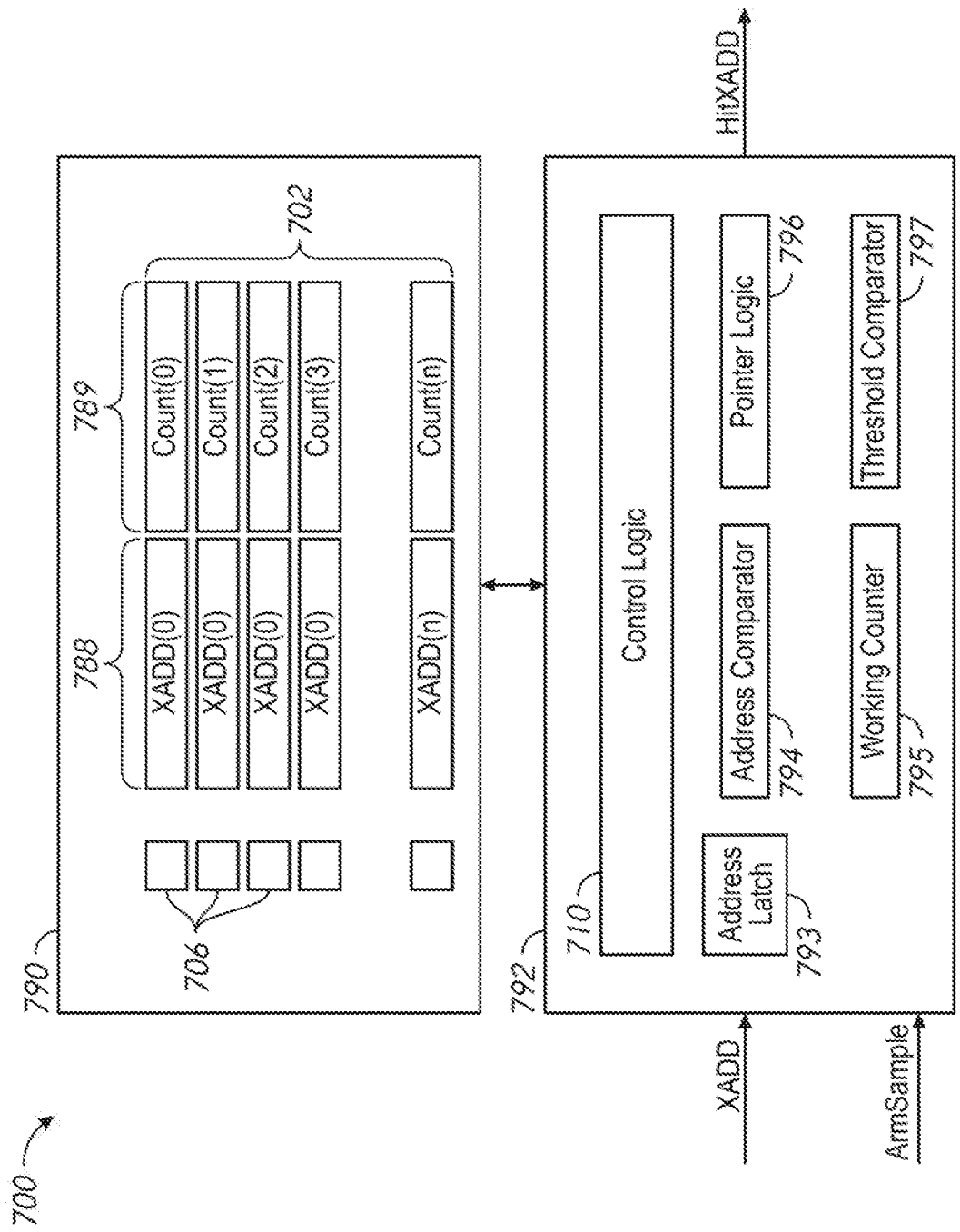
FIG. 7 is a block diagram of an aggressor detector circuit according to the present disclosure.

FIG. 7 is a block diagram of an aggressor detector circuit according to the present disclosure. The aggressor detector circuit 700 may implement the aggressor detector circuit 682 in some embodiments. The aggressor detector circuit 700 includes a stack 790 and stack control logic 792. The stack 790 may implement the stack 100 of FIG. 1 in some embodiments.

The stack 790 includes a number of files 702 each of which includes a row address field 788 which stores a row address XADD(Y) and an associated count value field 789 which stores a count value Count(Y). Each file 702 is associated with an accumulator circuit 706. The files 702 and accumulator circuits 706 are coupled to control logic 710 which may be used to perform an extremum search operation (e.g., as described in FIG. 2). Although not shown for clarity in FIG. 7, the stack 790 may generally use similar signals (e.g., Match(Y), Compare(X), etc.) as those discussed regarding the stack 100 of FIG. 1.

The stack 790 is coupled to a stack logic circuit 792 which may be used to provide signals and control the operation of the stack 790. The control logic circuit 710 which manages the extremum search operation may be included as part of the stack logic circuit 792 m some embodiments. The row address field 788 may include a number of bits (e.g., a number of CAM cells) based on the number of bits in a row address. For example, the row address field 788 may be 16 bits wide in some embodiments. The count value field 789 may have a number of bits based on a maximum possible value of the count values it is desired to track. For example, the count value field 789 may be 11 bits wide in some embodiments. In some embodiments, the stack 790 may have a depth (e.g., a number of files 702) of 100. Other widths and depths for the stack 790 may be used in other embodiments.

In some embodiments, the slack 790 may include additional fields in the files 702 which may be used to store additional information associated with the stored row address. For example, each file 702 may include an empty flag, which may be used to indicate if the data in the file 702 is ready to be overwritten or not. The empty flag may be a single bit, with a first state which indicates that the file is 'full' and a second state which indicates the file is empty (e.g., the information in the file is ready to be overwritten). When a row address and count are removed from the stack 790 (e.g., after their victims are refreshed) rather than delete the data in that file 702, the empty flag may be set to the second state instead.

When a row address XADD is received by the aggressor detector circuit 700, it may be stored in an address latch 793. In some embodiments, the stack logic circuit 792 may save a current value of the row address XADD in the address latch 793 when the signal ArmSample is provided. The address latch 793 may include a number of bits equal to the number of bits of a row address XADD. Thus, the address latch 793 may have a same width as the row address field 788 of the slack 790. The address latch 793 may include a number of latch circuits to store the bits of the row address. In some embodiments, the address latch 793 may include CAM cells (e.g., CAM cells 300 of FIG. 3) and may be structurally similar to the files 702 of the stack 790.

An address comparator 794 may compare the row address XADD stored in the address latch 793 to the addresses in the stack 790. The stack logic circuit 792 may perform a comparison operation based on the CAM cells of the stack 790. For example, as discussed in regards to FIG. 1, each CAM cell of each row address field 788 may be coupled in common to a signal line carrying a match signal. When an address is compared to the row address fields 788, the match signal lines may be pre-charged (e.g., by providing signals BitxCompPre and FindMaxMinOp of FIG. 2). The stack logic circuit 792 may then provide the address as a comparison signal in common to all of the row address fields 788. A first bit in each of the row address fields 788 may receive a first bit of the row address XADD for comparison, a second bit of each of the row address fields 788 may receive a second bit of the row address XADD and so forth.

After the CAM cells perform the comparison operation, the match signal may only remain at the pre-charged level (e.g., a high logical level) if every bit of the comparison address matched every bit of the stored address XADD(Y). The address comparator 794 may determine if there were any matches in the files where the accumulator signal is at a high level, based on the states of the match signals (e.g., the voltages on the match signal lines) and the accumulator signals.

If there is a match between the received address XADD and one of the stored addresses XADD(Y), the count value Count(Y) associated with that stored address XADD(Y) which matched may be updated. The count value Count(Y) may be read out to a working counter 795, which may update the numerical value of the count value Count(Y) and then write it back to the same file 702 associated with the matched stored address XADD(Y). For example, the working counter 795 may increment the count value Count(Y).

In some embodiments, the components of the accumulator circuit 706 may be used to provide additional functionality. For example, in the accumulator circuits 706 (e.g., as described in detail in the accumulator circuit 400 of FIG. 4) may also be used to serially read out the contents of a Count Value CAM for further operations, such as loading it into the working counter 795 and incrementing its value. For example when the address comparator indicates a match between the row address XADD and one of the stored addresses 788, that result may be coupled onto the corresponding match signal (e.g., Bitx Match) to the associated accumulator circuit 706, and then the signal BitxMatchAccumSample may be pulsed. Therefore only that file's accumulator signal MaxMinY would be high, thereafter allowing its corresponding match signal BixMatch_Y to be pre-charged high when the global BitxCompPre was asserted. Then only the comparison signal X_Compare for the selected bit of the Count Value CAM array would be asserted, (e.g., at a high logical level for example). The signals CrossRegCompPreF and CrossRegContp would then be used by the control logic 710 as previously described (e.g., in FIG. 4) to determine the contents of the selected count value 789 bit back to the control circuit 710 where it would be loaded into the Working Counter 795. This process would then be repeated for each bit. After the Working Counter 795 was incremented, the updated count would then be parallel-written back into the selected file's count value 789 (e.g., by providing the write signal CountWriteY).

If there is not a match between the received address XADD and one of the stored addresses XADD(Y), then the address XADD may be added to the stack 790. This may be done by providing a write signal along with the bits of XADD to one of the files of the stack 790. If there is room in the stack 790, then the received row address XADD may be stored in an empty file 702, and the working counter may set the associated count value in that file 702 to an initial value (e.g., 0, 1).

If there is not a match between the received address XADD and one of the stored addresses XADD(Y) and the stack 790 is full, the stack logic circuit 792 may replace one of the stored addresses currently in the stack 790 with the received address. In some embodiments, the control logic 710 may be used to perform an extremum search operation for a minimum of the stored count values Count(Y). The stack logic circuit 792 may then provide the new address XADD in common to all of the row address fields 788 along with a master write signal (e.g., CountWriteEn of FIG. 4) in common to all of the accumulator circuits 706. The accumulator circuits 706 may only provide the write signal to the files 702 which are associated with a minimum count value. Since in some embodiments, the accumulator circuits 706 may also break ties, this means that the write signal will only be provided to one file 702 and so the address XADD may be written to the file 702 which contains the minimum value. The identified minimum count value may then be reset to an initial value.

The stack logic circuit 792 may identify and provide a match address HitXADD based 011 the count values Count (Y) stored in the stack. In general, when one of the stored addresses XADD(Y) is provided as the match address HitXADD, the stored address XADD(Y) may be removed from stack 790 (or an empty flag of that file 702 may be set) and the count value Count(Y) may be reset to an initial value.

In some embodiments, the stack logic circuit 792 may include a threshold comparator circuit 797 which may compare the updated count value (e.g., after the count value is updated by the working counter 795) to a threshold value. If the updated count value is greater than the threshold value, then the stored address XADD(Y) associated with the updated count value may be provided as the match address HitXADD.

In some embodiments, the stack logic circuit 792 may provide the stored row address XADD(Y) associated with a maximum count value as the match address HitXADD. For example, the control logic 710 may perform an extremum search operation to locate a maximum value, and then may provide an index of the file 702 containing that maximum value and also the associated row address.

In some embodiments, the locations of the current maximum and or minimum values may be indicated by pointers, which may be operated by a pointer logic circuit 796. For example, the control logic 710 may perform an extremum search to locate an maximum value and then may return an index of the file 702 containing that maximum value. The pointer logic circuit 796 may direct a maximum pointer to indicate the file 702 containing the maximum value. New extremum search operations may be performed to update the maximum as count values change. When a match address needs to be provided, the maximum pointer may be used to quickly supply the address associated with the current maximum value.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a stack comprising a plurality of files, wherein each of the plurality of files is configured to store a numerical value comprising a plurality of stored bits;

a control logic circuit configured to provide a comparison signal to one of the stored bits in each of the plurality of files, wherein each of the plurality of files is configured to provide one of a plurality of match signals each of which indicates if the comparison signal matches the one of the plurality of stored bits of the numerical value in the associated one of the plurality of files;

a plurality of accumulator circuits each associated with a respective one of the plurality of files, each of the plurality of accumulator circuits comprising a latch circuit configured to store an accumulator signal, wherein each accumulator circuit is configured to keep the accumulator signal at a first logical level if the match signal from the associated one of the plurality of files indicates a match, and change the accumulator signal to a second logical level if the match signal does not indicate a match, unless none of the match signals of any of the plurality of files which have an accumulator signal at the first logical level indicates a match in which case the accumulator signal is kept at the first logical level, wherein the control logic circuit is further configured to determine which of the plurality of files contains an extremum value based on the values of the accumulator signals in the plurality of accumulator circuits.

2. The apparatus of claim 1, wherein the plurality of accumulator circuits are coupled in common to a signal line carrying an any match signal and wherein each of the plurality of accumulator circuits are configured to change a voltage of the signal line from a first voltage to a second voltage if the match signal associated with the accumulator circuit indicates a match.

3. The apparatus of claim 2, wherein the control logic circuit provides a sampling signal in common to the plurality of accumulator circuits, and wherein responsive to the sampling signal the plurality of accumulator circuits change a state of the accumulator signal from the first level to the second level if the associated one of the match signals does not indicate a match, and wherein the control logic circuit does not provide the sampling signal responsive to the signal line being at the second voltage.

4. The apparatus of claim 1, further comprising a memory array comprising a plurality of wordlines, wherein the plurality of files are each configured to store a row address associated with one of the plurality of wordlines and wherein the numerical value is associated with a number of accesses to the one of the plurality of wordlines.

5. The apparatus of claim 4, wherein victim addresses associated with the row address stored in the plurality of files are refreshed based on the logical level of the accumulator signal associated with the file.

6. The apparatus of claim 1, wherein the control logic circuit is configured to provide a signal which indicates which of the plurality of files is associated with an accumulator signal which is at the first logical level.

7. A method comprising:
providing a sequence of comparison bits to a content addressable memory (CAM) stack comprising a plurality of files, wherein each comparison hit is provided to one CAM cell in each file of the plurality of files;
performing a comparison operation for each of the sequence of comparison bits, wherein the comparison operation comprises:
determining, for each of the sequence of comparison bits if the comparison bit matches a stored hit in the CAM cell;
determining, for each of the sequence of comparison bits if the comparison bit matches any of the stored hits in any of the files of the CAM stack; and
setting a value of a plurality of accumulator signals each associated with one of the files, wherein the value of a respective one of the plurality of accumulator signals is changed from a first level to a second level when the comparison bit does not match the stored bit and when the comparison bit matched at least one file of the CAM stack where the accumulator signal is at the first level; and
determining which of the plurality of files contains an extremum value based on the values of the plurality of accumulator signals.

8. The method of claim 7, wherein the sequence of comparison bits are provided bit-by-bit from a most significant bit to a least significant bit.

9. The method of claim 7, wherein each comparison bit is provided at a high logical level and the extremum value is a maximum value.

10. The method of claim 7, wherein each comparison bit is provided at a low logical level and the extremum value is a minimum value.

11. The method of claim 7, further comprising resolving ties by keeping one of the accumulator signals which is at the level at the first level and setting a remainder of the accumulator signals at the first level to the second level.

12. The method of claim 7, further comprising after each comparison operation, determining if the extremum value has been identified and responsive to that determination not performing a remainder of the comparison operations.

13. The method of claim 7, further comprising writing a new value to selected ones of the plurality of files which are associated with accumulator signals at the first level.

14. The method of claim 7, further comprising setting the plurality of accumulator signals to the first state before providing the sequence of comparison bits.

15. An apparatus comprising:
a first stack comprising a plurality of content addressable memory (CAM) cells configured to store a first numerical value, where each bit of the first numerical value is stored in one of the plurality of CAM cells;
a second stack comprising a plurality of content addressable memory (CAM) cells configured to store a second numerical value, where each bit of the second numerical value is stored in one of the plurality of CAM cells;
a first accumulator circuit associated with the first stack, wherein the first accumulator circuit is configured to provide a first accumulator bit;
a second accumulator circuit associated with the second stack, wherein the second accumulator circuit is configured to provide a second accumulator bit; and
a control logic circuit configured to provide a sequence of comparison bits to the first stack and the second stack, wherein the first accumulator circuit and the second accumulator circuit are each configured to change a state of the respective first and the second accumulator bit based on a comparison of the first and the second numerical values to the comparison bits, wherein the control logic circuit is further configured to determine an extremum value between the first numerical value and the second numerical value based on the first and the second accumulator bit.

16. The apparatus of claim 15, wherein each of the plurality of CAM cells in the first and the second stack include a latch portion configured to store the bit of the first or the second numerical value and a comparator portion configured to change a state of a respective first or second match signal based on a comparison of the comparison bit and the stored bit.

17. The apparatus of claim 15, wherein the control logic is configured to provide the sequence of comparison bits such that a comparison bit is provided to a selected bit of the first plurality of CAM cells and a corresponding selected bit of the second plurality of CAM cells from a most significant bit to a least significant bit.

18. The apparatus of claim 15, wherein the first and the second accumulator circuit each comprise a latch circuit configured to store the respective first or the second accumulator bit.

19. An apparatus comprising:
a memory array comprising a plurality of wordlines; and
an aggressor detector circuit configured to receive a row address associated with one of the plurality of wordlines, the aggressor detector circuit comprising:
a stack comprising a plurality of files, each configured to store a row address and a count value associated with each of the stored row addresses;
a plurality of accumulator circuits each associated with one of the plurality of files, wherein the plurality of accumulator circuits are configured to store an accumulator bit associated with the count value; and
a control logic circuit configured to provide a sequence of comparison bits to the plurality of files, wherein the plurality of accumulator circuits are each configured to change a state of the respective accumulator bit based on a comparison of the associated count value to the comparison bits, wherein the control logic circuit is further configured to determine an extremum value of the count values in the plurality of files based on the associated accumulator bits.

20. The apparatus of claim 19, wherein the control logic is configured to determine an extremum value which is a minimum value, and wherein when the aggressor detector circuit receives the row address, the row address associated with the minimum value is replaced responsive to the plurality of files being full.

21. The apparatus of claim 19, further comprising a refresh address generator configured to determine a victim address based on a received match address, wherein the control logic is configured to determine an extremum value which is a maximum value, and wherein the row address associated with the maximum value is provided as the match address.

22. The apparatus of claim 19, wherein the plurality of files each comprise a plurality of content addressable memory (CAM) cells, each configured to store a bit of the row address or the count value.

23. The apparatus of claim 22, wherein each of the plurality of CAM cells comprise a latch portion configured to store the bit and a comparator portion configured to compare the provided comparison bit to the stored bit and change a state of a match signal based on the comparison.

* * * * *

UNITED STATES PATENT AND TRADEMARK OFFICE
CERTIFICATE OF CORRECTION

PATENT NO. : 11,158,373 B2
APPLICATION NO. : 16/437811
DATED : October 26, 2021
INVENTOR(S) : Daniel B. Penney and Jason M. Brown It is certified that error appears in the above-identified patent and that said Letters Patent is hereby corrected as shown below:

In the Claims

| | Reads | Should Read |
|---|---|---|
| Column 27, Line 60, Claim 7 | "wherein each comparison hit" | -- wherein each comparison bit -- |
| Column 27, Line 66, Claim 7 | "comparison bit matches a stored hit in the CAM cell" | -- comparison bit matches a stored bit in the CAM cell -- |
| Column 28, Line 3, Claim 7 | "any of the stored hits in any of the files of the CAM stack" | -- any of the stored bits in any of the files of the CAM stack -- |

Signed and Sealed this
Seventh Day of June, 2022

Katherine Kelly Vidal
*Director of the United States Patent and Trademark Office*